US009841577B2

(12) United States Patent
Lippert

(10) Patent No.: US 9,841,577 B2
(45) Date of Patent: Dec. 12, 2017

(54) OPTICAL ELEMENT UNIT

(71) Applicant: Carl Zeiss SMT GmbH, Oberkochen (DE)

(72) Inventor: Johannes Lippert, Buch am Wald (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/251,265

(22) Filed: Aug. 30, 2016

(65) Prior Publication Data

US 2017/0082824 A1 Mar. 23, 2017

Related U.S. Application Data

(63) Continuation of application No. 14/939,357, filed on Nov. 12, 2015, now Pat. No. 9,435,980, which is a continuation of application No. 14/484,502, filed on Sep. 12, 2014, now Pat. No. 9,195,025, which is a continuation of application No. 14/070,144, filed on Nov. 1, 2013, now Pat. No. 8,854,743, which is a continuation of application No. 13/081,996, filed on Apr. 7, 2011, now Pat. No. 8,599,502, which is a continuation of application No. 11/370,464, filed on Mar. 8, 2006, now Pat. No. 7,944,628.

(60) Provisional application No. 60/659,845, filed on Mar. 9, 2005.

(51) Int. Cl.
*G02B 7/02* (2006.01)
*G03G 15/04* (2006.01)
*G02B 7/182* (2006.01)
*G03F 7/20* (2006.01)

(52) U.S. Cl.
CPC ............. *G02B 7/023* (2013.01); *G02B 7/021* (2013.01); *G02B 7/182* (2013.01); *G03F 7/7015* (2013.01); *G03G 15/0409* (2013.01)

(58) Field of Classification Search
CPC .......... G02B 7/028; G02B 7/02; G02B 7/008; G02B 7/022; G02B 7/026; G02B 7/181; G02B 7/1815; G02B 21/33
USPC .................................................. 359/811–830
See application file for complete search history.

(56) References Cited

U.S. PATENT DOCUMENTS

| | | |
|---|---|---|
| 7,944,628 B2 | 5/2011 | Lippert |
| 8,599,502 B2 | 12/2013 | Lippert |
| 8,854,743 B2 | 10/2014 | Lippert |
| 9,195,025 B2 | 11/2015 | Lippert |
| 9,435,980 B2 | 9/2016 | Lippert |

(Continued)

FOREIGN PATENT DOCUMENTS

WO WO 2005/006416 1/2005

*Primary Examiner* — Mahidere Sahle
(74) *Attorney, Agent, or Firm* — Fish & Richardson P.C.

(57) ABSTRACT

An optical element unit is provided comprising an optical element group for projecting light along an optical axis of the optical element group and a housing having an inner housing part partly defining a first space and a light passageway between the inner housing part and a second space. The inner housing part receives the optical element group. The optical element group comprises an ultimate optical element located in the region of the light passageway. A load-relieving device is provided adjacent to the ultimate optical element, the load relieving device partly defining the first space and the second space and at least partly relieving the ultimate optical element from loads resulting from pressure differences between the first space.

23 Claims, 13 Drawing Sheets

(56) References Cited

U.S. PATENT DOCUMENTS

| | | |
|---|---|---|
| 2003/0076602 A1 | 4/2003 | Nishikawa |
| 2005/0046815 A1 | 3/2005 | Ebinuma et al. |
| 2005/0122600 A1 | 6/2005 | Yoshizawa |
| 2006/0103944 A1 | 5/2006 | Ono et al. |
| 2006/0238892 A1 | 10/2006 | Lippert |
| 2007/0171552 A1 | 7/2007 | Holderer et al. |
| 2011/0279914 A1 | 11/2011 | Lippert |
| 2014/0064791 A1 | 3/2014 | Lippert |
| 2015/0098140 A1 | 4/2015 | Lippert |
| 2016/0161700 A1 | 6/2016 | Lippert |

OPTICAL ELEMENT UNIT

CROSS-REFERENCE TO RELATED APPLICATIONS

This application is a continuation of, and claims benefit under 35 USC 120 to, U.S. application Ser. No. 14/939,357, filed Nov. 12, 2015, now U.S. Pat. No. 9,435,980, which is a continuation of, and claims benefit under 35 USC 120, to U.S. application Ser. No. 14/484,502, filed Sep. 12, 2014, now U.S. Pat. No. 9,195,025, which is a continuation of U.S. application Ser. No. 14/070,144, filed Nov. 1, 2013, now U.S. Pat. No. 8,854,743, which is a continuation of U.S. application Ser. No. 13/081,996, filed Apr. 7, 2011, now U.S. Pat. No. 8,599,502, which is a continuation of U.S. application Ser. No. 11/370,464, filed Mar. 8, 2006, now U.S. Pat. No. 7,944,628, which claims priority to U.S. Provisional Application No. 60/659,845, filed Mar. 9, 2005. The contents of each of these applications are hereby incorporated by reference in its entirety.

BACKGROUND OF THE INVENTION

1. Field of the Invention

The present invention relates to optical element units used in exposure processes, in particular to optical element units of microlithography systems. It further relates to optical exposure apparatuses comprising such optical element units. Furthermore, it relates to methods of manufacturing such optical element units. The invention may be used in the context of photolithography processes for fabricating microelectronic devices, in particular semiconductor devices, or in the context of fabricating devices, such as masks or reticles, used during such photolithography processes.

2. Description of the Related Art

Typically, the optical systems used in the context of fabricating microelectronic devices such as semiconductor devices comprise a plurality of optical elements, such as lenses and mirrors etc., in the light path of the optical system. Those optical elements usually cooperate in an exposure process to transfer an image formed on a mask, reticle or the like onto a substrate such as a wafer. The optical elements are usually combined in one or more functionally distinct optical element groups. These distinct optical element groups may be held by distinct optical exposure units. Such optical exposure units are often built from a stack of optical element modules holding one or more optical elements. These optical element modules usually comprise an external generally ring shaped support device supporting one or more optical element holders each, in turn, holding an optical element.

Optical element groups comprising at least mainly refractive optical elements, such as lenses, mostly have a straight common axis of symmetry of the optical elements usually referred to as the optical axis. Moreover, the optical exposure units holding such optical element groups often have an elongated substantially tubular design due to which they are typically referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture and increased imaging accuracy of the optical system.

Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system. As a consequence, the optical elements of such an optical system must be supported in a defined manner in order to maintain a predetermined spatial relationship between the optical elements to provide a high quality exposure process.

Depending on the wavelength of the light used in such exposure processes, it is often necessary to maintain a gas atmosphere within the respective optical element units in order to reduce absorption effects. During the exposure process pressure differences between the gas atmosphere within the optical element unit and the environment surrounding the optical element unit may occur. These pressure differences may cause a position variation of the ultimate optical element, typically a so called last lens element, located near or at the exit end of the optical element unit and typically separating the interior of the optical element unit from the surrounding environment.

Depending on the design of the respective last lens element, in particular on the optical sensitivity of the last lens element to position variations, such position variations may have a considerable adverse effect on the imaging accuracy and, thus, on the overall quality of the exposure process. To largely avoid these effects, currently, considerable effort is necessary to hold such an ultimate optical element in a manner which is as rigid as possible. This is particularly complicated if, for other purposes, the ultimate optical element has to be held in an adjustable manner.

SUMMARY OF THE INVENTION

It is thus an object of the present invention to, at least to some extent, overcome the above disadvantages and to provide good and long term reliable imaging properties of an optical system used in an exposure process.

It is a further object of the present invention to maintain imaging accuracy of an optical system used in an exposure process by reducing the sensitivity of the optical system to pressure differences between an atmosphere within an optical element unit of the optical system and the environment surrounding the optical element unit.

These objects are achieved according to the present invention which is based on the teaching that a reduction of the sensitivity of the optical system to pressure differences between an atmosphere within an optical element unit of the optical system and the environment surrounding the optical element unit may be achieved when the the optical element potentially subjected to loads resulting from such pressure differences is at least partially relieved from such loads resulting from such pressure differences.

Thus, according to a first aspect of the present invention there is provided an optical element unit comprising an optical element group for projecting light along an optical axis of the optical element group and a housing having an inner housing part partly defining a first space and a light passageway between the inner housing part and a second space. The inner housing part receives the optical element group. The optical element group comprises an ultimate optical element located in the region of the light passageway and being part of an ultimate optical element arrangement. A load relieving device is provided adjacent to the ultimate optical element arrangement, the load relieving device partly defining the first space and the second space and at least partly relieving the ultimate optical element arrangement from loads resulting from pressure differences between the first space and the second space.

According to a second aspect of the present invention there is provided an optical element unit comprising an optical element group for projecting light along an optical axis of the optical element group, a housing and a cover device. The housing has an inner housing part partly defining a first space and a light passageway between the first space and a second space, the inner housing part receiving the optical element group. The optical element group comprises an ultimate optical element located in the region of the light passageway and having an optically used first surface. The cover device is mounted to the housing and extends between the housing and the first surface of the ultimate optical element. Furthermore, the cover device leaves a first surface part of the first surface of the ultimate optical element uncovered while it covers a second surface part of the first surface of the ultimate optical element.

According to a third aspect of the present invention there is provided an optical element unit comprising an optical element group for projecting light along an optical axis of the optical element group, a housing and a sealing device. The housing has an inner housing part partly defining a first space and a light passageway between the first space and a second space, the inner housing part receiving the optical element group. The optical element group comprises an ultimate optical element located in the region of the light passageway and a further optical element. The sealing device separates the first space from the second space. The sealing device is located between the further optical element and the ultimate optical element such that the ultimate optical element is located within the second space. Furthermore, the sealing device has least a first translucent section.

According to a fourth aspect of the present invention there is provided an optical exposure apparatus for transferring an image of a pattern formed on a mask onto a substrate comprising a light path, a mask location located within the light path and receiving the mask, a substrate location located at an end of the light path and receiving the substrate, and an optical element unit according to the present invention located within the light path between the mask location and the and the substrate location.

According to a fifth aspect of the present invention there is provided a method of holding an optical element, comprising providing a housing having an inner housing part partly defining a first space and a light passageway between the inner housing part and a second space, a first pressure prevailing in the first space and a second pressure prevailing in the second space; providing and holding an optical element in the region of the light passageway, the optical element mainly extending in a first plane, a first part of the optical element partly defining the first space and a second part of the optical element partly defining the second space; and separating the first space and the second space such that a projection of the first part of the optical element onto the first plane is smaller than a projection of the second part of the optical element onto the first plane.

According to a sixth aspect of the present invention there is provided a method of holding an optical element, comprising providing a housing having an inner housing part partly defining a first space and a light passageway between the inner housing part and a second space, a first pressure prevailing in the first space and a second pressure prevailing in the second space; providing and holding an optical element in the region of the light passageway; and separating the first space and the second space in a pressure tight but at least partly translucent manner such that the optical element is entirely located within the second space.

Further aspects and embodiments of the present invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

Figure 1:
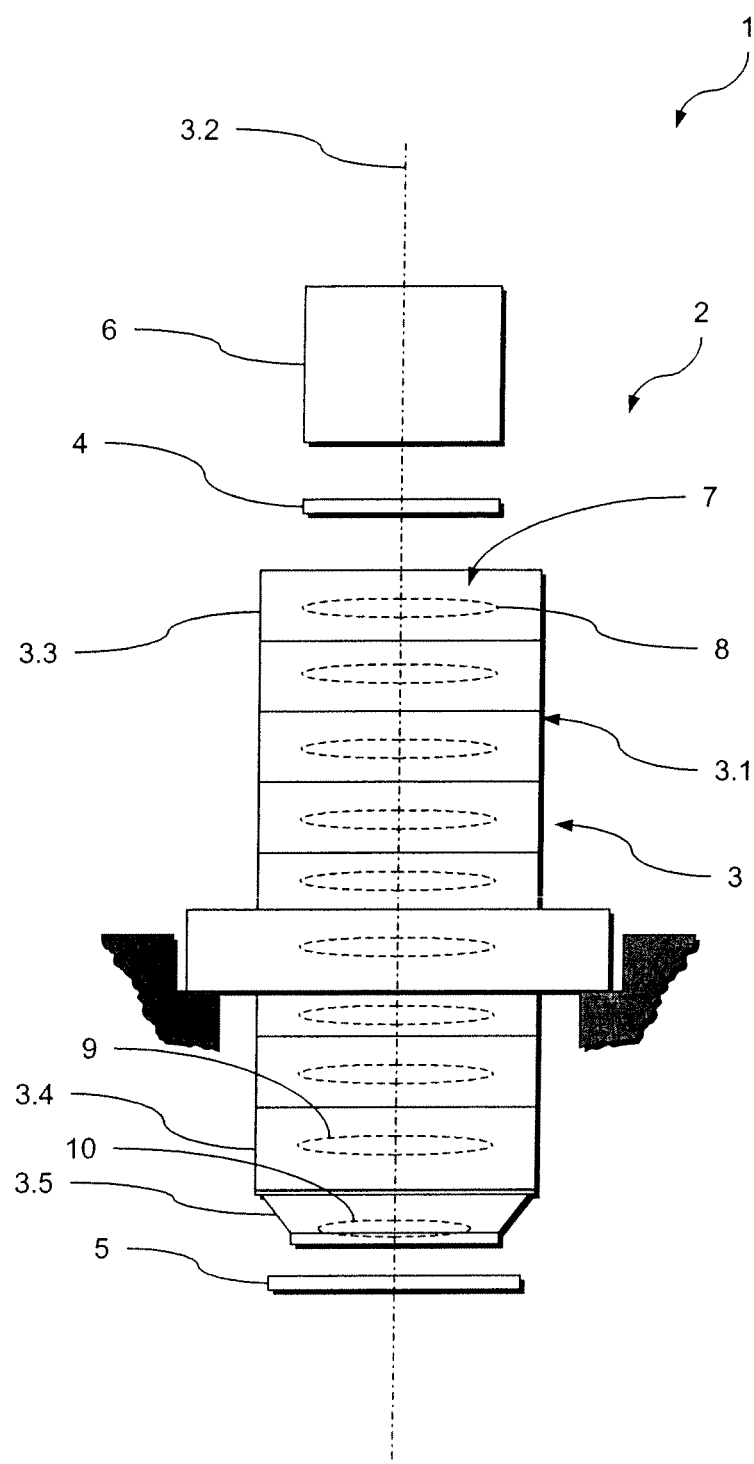
FIG. 1 is a schematic representation of a preferred embodiment of an optical exposure apparatus according to the present invention comprising a preferred embodiment of an optical element unit according to the present invention.

In the following, a first preferred embodiment of an optical exposure apparatus 1 according to the present invention comprising an optical projection system 2 with an optical element unit 3 according to the present invention will be described with reference to FIGS. 1 to 3.

The optical exposure apparatus 1 is adapted to transfer an image of a pattern formed on a mask 4 onto a substrate 5. To this end, the optical exposure apparatus 1 comprises an illumination system 6 illuminating the mask 4 and the optical element unit 3. The optical element unit 3 projects the image of the pattern formed on the mask 4 onto the substrate 5, e.g. a wafer or the like.

To this end, the optical element unit 3 holds an optical element group 7. This optical element group 7 is held within a housing 3.1 of the optical element unit 3. The optical element group 7 comprises a number of optical elements 8 and optical elements 9 and 10, such as lenses, mirrors or the like. These optical elements 8, 9, 10 are aligned along an optical axis 3.2 of the optical element unit 3.

The optical projection system 2 receives the part of the light path between the mask 4 and the substrate 5. Its optical elements 8, 9, 10 cooperate to transfer the image of the pattern formed on the mask 4 onto the substrate 5 located at the end of the light path. To this end, the optical elements 8, 9, 10 of the optical element group 7 project the light received form the illumination system 6 along the optical axis 3.2.

The optical element unit 3 is composed of a plurality of optical element modules 3.3 and optical element modules 3.4 and 3.5 stacked and tightly connected to form the optical exposure unit 3. Each optical element module 3.3, 3.4, 3.5 holds one or more of the optical elements 8, 9, 10, respectively.

Figure 2:
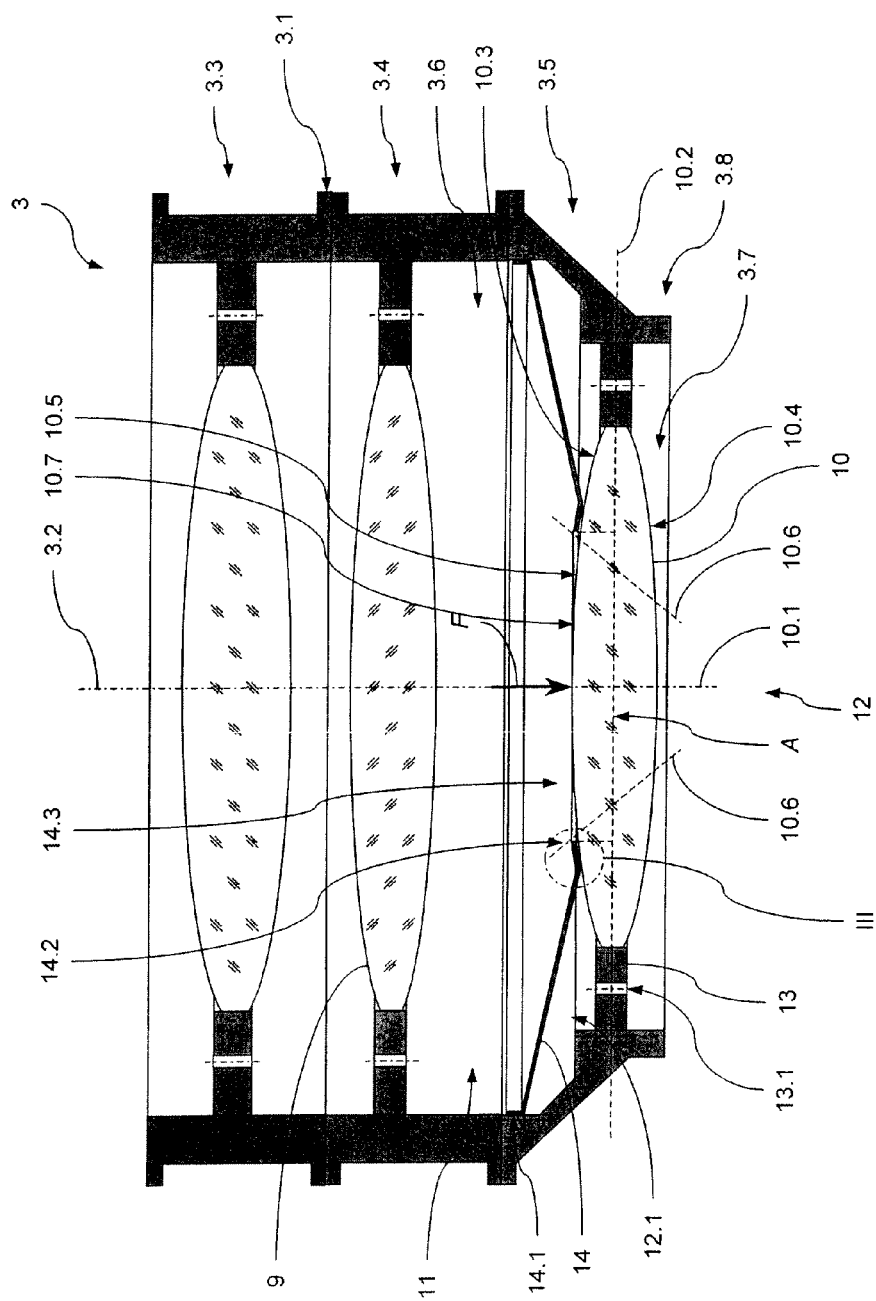
FIG. 2 is a schematic sectional representation of a part of the optical element unit of the optical exposure apparatus of FIG. 1.

FIG. 2 shows a schematic sectional representation of the last three optical element modules 3.3, 3.4 and 3.5 of the optical element unit 3. As can be seen in particular from this Figure, the housing 3.1 has an inner housing part 3.6 partly defining a first space 11 and a light passageway 3.7 between the inner housing part 3.6 and a second space 12 open to the environment surrounding the housing 3.1. While a first pressure prevails in the first space 11, a second pressure prevails in the second space 12.

Within this light passageway 3.7, located at the exit end 3.8 of the optical element unit 3, there is provided an ultimate optical element arrangement comprising an ultimate optical element in the form of a last lens element 10 and an ultimate optical element holder in the form of a last lens element holder 13. The last lens element holder 13 is holding the last lens element 10 so as to be adjustable in position. This last lens element 10 partly separates the first space 11 and the second space 12 and, thus, partly defines the first space 11 and the second space 12.

The last lens element 10 is a rotationally symmetric lens having a first axis of symmetry 10.1 essentially coinciding with the optical axis 3.2 of the optical element unit 3. The last lens element 10 mainly extends in a first plane perpendicular to the first axis of symmetry 10.1, as it is indicated in FIG. 2 by the dashed line 10.2. Furthermore, the last lens element 10 has a first perpendicular projection onto the first plane 10.2 which has a first area A1.

The last lens element 10 has a first optical element surface in the form of a first lens surface 10.3 and a second optical element surface in the form of a second lens surface 10.4.

The first lens surface 10.3 faces towards the penultimate optical element 9 of the optical element group 7. The second lens surface 10.4 faces away from the penultimate optical element 9 of the optical element group 7.

The first lens surface 10.3 has a first surface region 10.5 optically used during an exposure process. This first surface region 10.5 is of circular shape. The outer circumference of the first surface region 10.5 is indicated in FIG. 2 by the intersection of the dashed lines 10.6 with the first lens surface 10.3.

Between the last lens element 10 and the penultimate optical element 9, a cover device in the form of a thin walled cover 14 is provided within the inner housing part 3.6. This cover 14 substantially has the form of a truncated conical shell. At its outer circumference 14.1, the thin walled cover 14 is mounted to the housing 3.1 in a substantially pressure tight manner.

A third space 12.1 is defined by the housing 3.1, the last lens element holder 13, the last lens element and the cover 14. This third space 12.1 communicates with the environment on the other side of the last lens element holder 13 via venting openings 13.1 within the last lens element holder 13. Thus, the third space 12.1 forms part of the second space 12, the second pressure also prevailing in the third space 12.1.

In this context, it will be appreciated that, with other embodiments of the present invention, the venting openings or venting passageways, additionally or alternatively, may also be provided in the housing and the ultimate optical element, respectively.

The cover 14 extends between the housing 3.1 and the last lens element 10. At its inner circumference 14.2, the cover 14 is located immediately adjacent to the first lens surface, thereby forming an aperture 14.3 at this inner circumference 14.2. This aperture 14.3 leaves a certain part of the first lens surface 10.3 uncovered by the cover 14.

Figure 3:
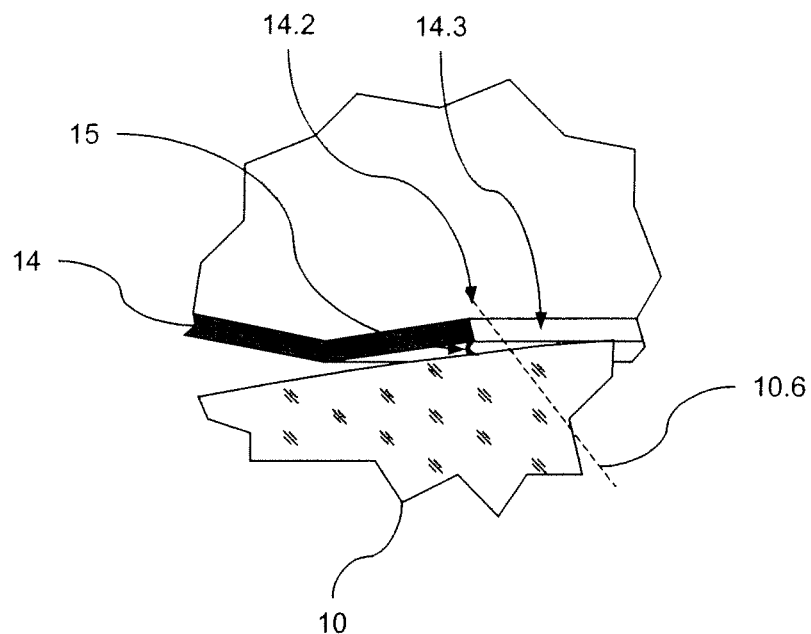
FIG. 3 is a schematic sectional view of the detail III of FIG. 2.

The cover 14 is not contacting the last lens element 10 directly, as can be seen from FIG. 3 in greater detail. In the embodiment shown, the cover 14 contacts the last lens element 10 via a sealing element in the form of a thin sealing membrane 15. This sealing membrane 15 extends between the inner circumference 14.2 of the cover 14 and the last lens element 10. The sealing membrane 15 is connected to the cover 14 and the last lens element 10 in a pressure tight manner.

Thus, the first space 11 and the second space 12 are separated by the cover 14, the sealing membrane 15 and the last lens element 10 in a pressure tight manner to avoid contamination of the first space 11 with contaminants from the environment surrounding the housing.

The cover 14 is located such that a first part of the last lens element 10 partly defines the first space 11 and that a second part of the last lens element 10 partly defines the second space 12. The perpendicular projection of this first part of the last lens element 10 onto the first plane 10.2 is smaller than the perpendicular projection of this second part of the last lens element 10 onto the first plane 10.2.

The cover 14 has the beneficial effect that only a second surface region 10.7 of the first lens surface 10.3 is subjected to the first pressure prevailing in the first space 11 while the rest of the lens surface and also the last lens element holder 13 is subjected to the second pressure prevailing in the second space 12. The outer circumference of this second surface region 10.7 is defined by the sealing membrane 15 contacting the first lens surface 10.3.

Thus, the force F acting in the direction of the optical axis 3.2 on the last lens element 10 in the direction of the optical axis 3.2 due to pressure differences between the first pressure $p_1$ in the first space 11 and the second pressure $p_2$ in the second space 12 may be calculated as follows:

$$F = A_{ssr} \cdot (p_1 - p_2) = A_{ssr} \cdot dp, \quad (1)$$

wherein: $A_{ssr}$, is the area of the perpendicular projection of the second surface region 10.7 onto the first plane 10.2;

dp is the pressure difference between the first pressure $p_1$ in the first space 11 and the second pressure $p_2$ in the second space 12.

Consequently, a variation Δdp in the pressure difference dp will result in a variation ΔF in the force F which calculates as follows:

$$\Delta F = A_{ssr} \cdot \Delta dp. \quad (2)$$

As becomes apparent from equation (2), compared to a conventional design without a cover 14, the cover 14 considerably reduces the variation ΔF in the force F acting on the last lens element 10 due to a variation Δdp in the pressure difference dp between the first space 11 and the second space 12.

Thus, compared to a conventional design without a cover 14, at a given pressure variation Δdp and a given rigidity of the last lens element holder 13 in the direction of the optical axis 3.2 a lower position variation of the last lens element 10 due to this variation Δdp is achieved with the cover 14 according to the invention. Thus, the cover 14 with the sealing membrane 15 forms a load relieving device relieving the last lens element 10 and, thus, the ultimate optical element arrangement from loads resulting from pressure differences within the first space 11 and the second space 12.

As a consequence, to keep certain position variation limits for the last lens element 10 during operation, less effort is required for the rigidity of the last lens element holder 13 in the direction of the optical axis.

It will be appreciated that, to achieve this beneficial effect according to the invention, the aperture 14.3 has a second perpendicular projection onto the first plane 10.2 with a second area $A_2$ which is smaller than the first area $A_1$ of the first perpendicular projection of the last lens element 10 onto the first plane 10.2.

To largely take advantage of this beneficial effect without affecting the optical performance of the optical system, the aperture 14.3 is located as close as possible to the first surface region 10.5 optically used during an exposure process, as it is shown in the FIGS. 2 and 3. Thus, the second area $A_2$ substantially corresponds to of the third perpendicular projection of the first surface region 10.5 onto the first plane 10.2.

In other words, the aperture 14.3 is located as close as possible to the first surface region 10.5 optically used during an exposure process such as to leave uncovered only the first surface region 10.5 while covering the rest of the first surface 10.3.

It will be appreciated that, with other embodiments of the present invention, the first surface region optically used may be smaller than the aperture provided by the cover.

Thus, the third area $A_3$ may be smaller than the second area $A_2$. Anyway, preferably, the third area $A_3$ corresponds to at least 80% of the second area $A_2$.

In other words, the aperture may leave uncovered a part of the first surface which is larger than the first surface region optically used and which is including the first surface region optically used. Anyway, preferably, the first surface region optically used corresponds to at least 80% of the part of the first surface left uncovered by the aperture.

Furthermore, It will be appreciated that, with other embodiments of the present invention, depending on the dimensions of the ultimate optical element and the ultimate optical element holder, the aperture may even leave uncovered the entire first surface such that the cover only covers at least a part of the ultimate optical element holder. With comparably large ultimate optical element holders, in particular, this may as well provide a sufficient relief of the ultimate optical element arrangement from stresses resulting from pressure differences between the first space and the second space.

Furthermore, It will be appreciated that, to achieve the above beneficial effects, with other embodiments of the present invention, depending on the rigidity distribution of the ultimate optical element holder, the cover, at its outer circumference, instead of being mounted to the housing 3.1, may also be mounted to the ultimate optical element holder. This may be done at a location where the unit formed by the housing and the ultimate optical element holder connected thereto still has a rigidity which is sufficient that forces introduced by the cover into the ultimate optical element holder do not substantially dislocate the ultimate optical element. Depending on the design of the ultimate optical element holder, such a location may, for example, be located at the outer circumference of the ultimate optical element holder close to the housing of the ultimate optical element unit.

The cover 14 is formed by a thin sheet metal. Anyway, it will be appreciated that, with other embodiments of the present invention, the cover may also be formed by one or more layers of metal and/or of different materials such as composite materials, plastics, ceramics, glass and any combination thereof.

The cover 14 has a rigidity in the direction of the optical axis 3.2 which is sufficient to prevent direct contact of the cover 14 with the last lens element 10 under any pressure difference between the first space 11 and the second space 12 that is to be expected during normal use of the optical element unit 3. Anyway, the cover 14, within the limitations stated above, may undergo deformations. Thus, the cover 14 may be of very simple and lightweight design occupying relatively few space.

Since the cover 14 is a part mounted separately to the housing 3.1, the distance between the last lens element 10 and the inner circumference of the cover may easily be adjusted to the specific requirements of the respective application. Furthermore, it will be appreciated that either one of the cover 14 and the last lens element 10 may be adapted in geometry and surface properties, respectively, to provide appropriate or optimized sealing boundaries within the gap between them.

Anyway, it will be appreciated that, with other embodiments of the present invention, the cover may also be formed monolithically with the part of the housing provided by the last optical element module.

The sealing membrane 15 allows for relative motions between the cover 14 and the last lens element 10 caused by such variations in the pressure difference between the first space 11 and the second space 12.

It will be appreciated that, with other embodiments of the present invention, instead of the sealing membrane 15, another type of elastic sealing element or sealing substance, such as an elastic glue or the like, may be located between the cover and the last lens element. Furthermore, a substantially rigid connection between the cover and the last lens element may be chosen, provided that the cover in itself is of sufficient rigidity in the direction of the optical axis so as to not transfer a substantial part of the loads resulting from pressure differences between the first and second space onto the ultimate optical element.

In the following, a preferred embodiment of a method of manufacturing the optical element unit 3 of FIG. 1 including a preferred embodiment of a method of holding an optical element according to the present invention will be described with reference to FIGS. 1 to 4.

Figure 4:
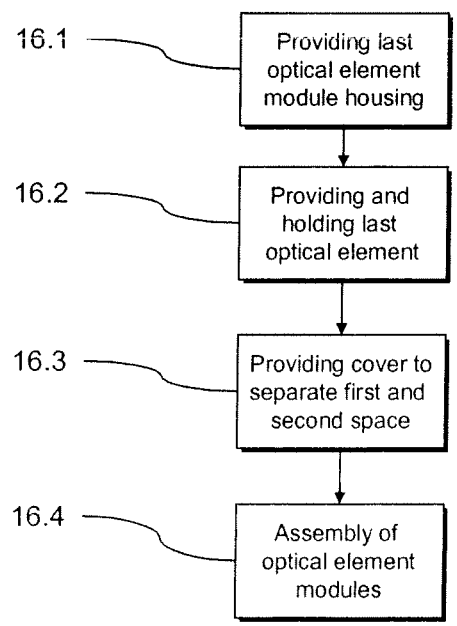
FIG. 4 is a block diagram of a preferred embodiment of a method of manufacturing the optical element unit of FIG. 1 including a preferred embodiment of a method of holding an optical element according to the present invention.

FIG. 4 shows a block diagram of a preferred embodiment of a method of manufacturing the optical element unit 3 of FIG. 1 including a preferred embodiment of a method of holding an optical element according to the present invention.

In a first step 16.1 the housing of the last optical element module 3.5 is provided providing a part of the housing 3.1 and the inner housing part 3.6 partly defining the first space 11 and the light passageway 3.7.

In a second step 16.2, the last lens element 10 is provided and held in the region of the light passageway 3.7 to provide a configuration as it has been described above in the context of FIGS. 1 to 3.

In a third step 16.3, the first space 11 and the second space 12 are separated by means of the cover 14 to provide a configuration as it has been described above in the context of FIGS. 1 to 3. To this end the cover 14 is mounted in a pressure tight manner to the part of the housing 3.1 the last optical element module 3.5 provides. Furthermore, the cover 14 is connected in a pressure tight manner to the last lens element 10 via the sealing membrane 15 to provide a configuration as it has been described above in the context of FIGS. 1 to 3.

Finally, in a fourth step, the other optical element modules 3.3 to 3.4 are provided and the optical element modules 3.3 to 3.5 are assembled to form the optical element unit 3 in order to provide a configuration as it has been described above in the context of FIGS. 1 to 3.

It will be appreciated that the steps 16.1 to 16.3 form part of a preferred embodiment of a method of holding an optical element according to the invention. Furthermore, it will be appreciated that, with other embodiments of the present invention, the above steps may be executed in any suitable different order to achieve the configuration as it has been described above in the context of FIGS. 1 to 3.

Second Embodiment

Figure 5:
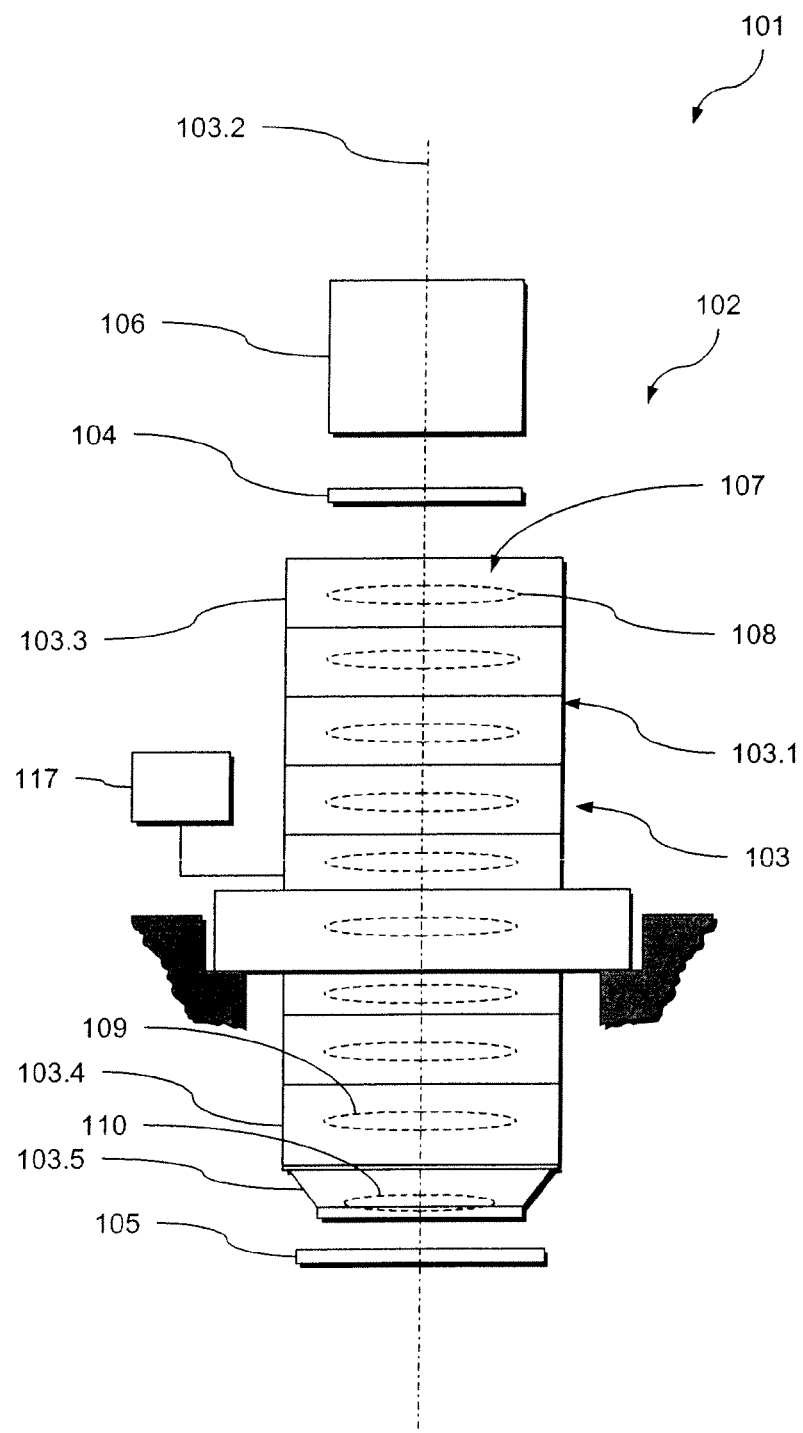
FIG. 5 is a schematic representation of a further preferred embodiment of an optical exposure apparatus according to the present invention comprising a preferred embodiment of an optical element unit according to the present invention.

In the following, a second preferred embodiment of an optical exposure apparatus 101 according to the present invention comprising an optical projection system 102 with an optical element unit 103 according to the present invention will be described with reference to FIGS. 5 and 6.

The optical exposure apparatus 101 is adapted to transfer an image of a pattern formed on a mask 104 onto a substrate 105. To this end, the optical exposure apparatus 101 comprises an illumination system 106 illuminating the mask 104 and the optical element unit 103. The optical element unit 103 projects the image of the pattern formed on the mask 4 onto the substrate 105, e.g. a wafer or the like.

To this end, the optical element unit 103 holds an optical element group 107. This optical element group 107 is held within a housing 103.1 of the optical element unit 103.

The optical element group 107 comprises a number of optical elements 108 and optical elements 109 and 110, such as lenses, mirrors or the like. These optical elements 108, 109, 110 are aligned along an optical axis 103.2 of the optical element unit 103.

The optical projection system 102 receives the part of the light path between the mask 104 and the substrate 105. Its optical elements 108, 109, 110 cooperate to transfer the image of the pattern formed on the mask 104 onto the substrate 105 located at the end of the light path. To this end, the optical elements 108, 109, 110 of the optical element group 107 project the light received form the illumination system 106 along the optical axis 103.2.

The optical element unit 103 is composed of a plurality of optical element modules 103.3 and optical element modules 103.4 and 103.5 stacked and tightly connected to form the optical exposure unit 103. Each optical element module 103.3, 103.4, 103.5 holds one or more of the optical elements 108, 109, 110, respectively.

The optical element modules 103.3, 103.4, 103.5 largely correspond to the optical element modules 3.3, 3.4 and 3.5 of the optical element unit 3 as shown in FIG. 2. Thus, it will here be mainly referred to the differences.

Figure 6:
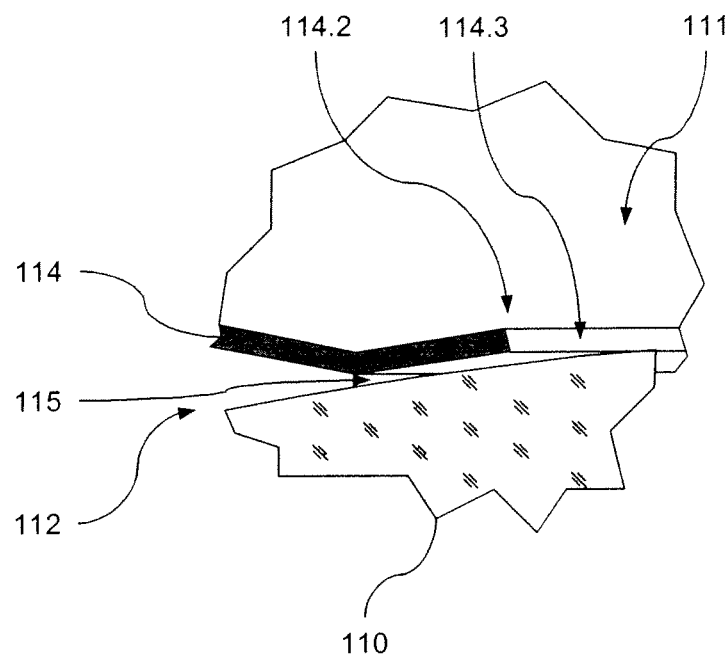
FIG. 6 is a schematic sectional view of a detail of a further preferred embodiment of an optical element unit according to the present invention used in the optical exposure apparatus of FIG. 5.

As may be seen from FIG. 6, the only difference with respect to the embodiment of FIGS. 1 to 3 lies within the fact that, instead of a sealing membrane 15, a sealing gap 115 is formed between the inner circumference 114.2 of the cover 114 and the last lens element 110.

To avoid contamination of the first space 111 with contaminants from the environment surrounding the housing, the first pressure in the first space 111 is kept slightly superior to the second pressure in the second space 112 by a pressurizing unit 117 connected to the first space 111. Thus, a slight flow of the gas the first space 111 is filled with is maintained through the sealing gap 115 towards the second space 112.

Apart from the described difference, the optical element modules 103.3, 103.4, 103.5 are identical with the optical element modules 3.3, 3.4 and 3.5 of the optical element unit 3 as shown in FIG. 2. Thus, for further details, it is here referred to the above description of the optical element unit 3.

It will be appreciated that, with other embodiments of the invention, instead of the pressure tight connection between the housing and the cover 14 and 114, respectively, a connection with a narrow sealing gap as described above may be provided.

Third Embodiment

In the following, a third preferred embodiment of an optical exposure apparatus 201 according to the present invention comprising an optical projection system 202 with an optical element unit 203 according to the present invention will be described with reference to FIGS. 7 to 9.

The optical exposure apparatus 201 is adapted to transfer an image of a pattern formed on a mask 204 onto a substrate 205. To this end, the optical exposure apparatus 201 comprises an illumination system 206 illuminating the mask 204 and the optical element unit 203. The optical element unit 203 projects the image of the pattern formed on the mask 4 onto the substrate 205, e.g. a wafer or the like.

To this end, the optical element unit 203 holds an optical element group 207. This optical element group 207 is held within a housing 203.1 of the optical element unit 203. The optical element group 207 comprises a number of optical elements 208 and optical elements 209 and 210, such as lenses, mirrors or the like. These optical elements 208, 209, 210 are aligned along an optical axis 203.2 of the optical element unit 203.

The optical projection system 202 receives the part of the light path between the mask 204 and the substrate 205. Its optical elements 208, 209, 210 cooperate to transfer the image of the pattern formed on the mask 204 onto the substrate 205 located at the end of the light path. To this end, the optical elements 208, 209, 210 of the optical element group 207 project the light received form the illumination system 206 along the optical axis 203.2.

The optical element unit 203 is composed of a plurality of optical element modules 203.3 and optical element modules 203.4 and 203.5 stacked and tightly connected to form the optical exposure unit 203. Each optical element module 203.3, 203.4, 203.5 holds one or more of the optical elements 208, 209, 210, respectively.

Figure 8:
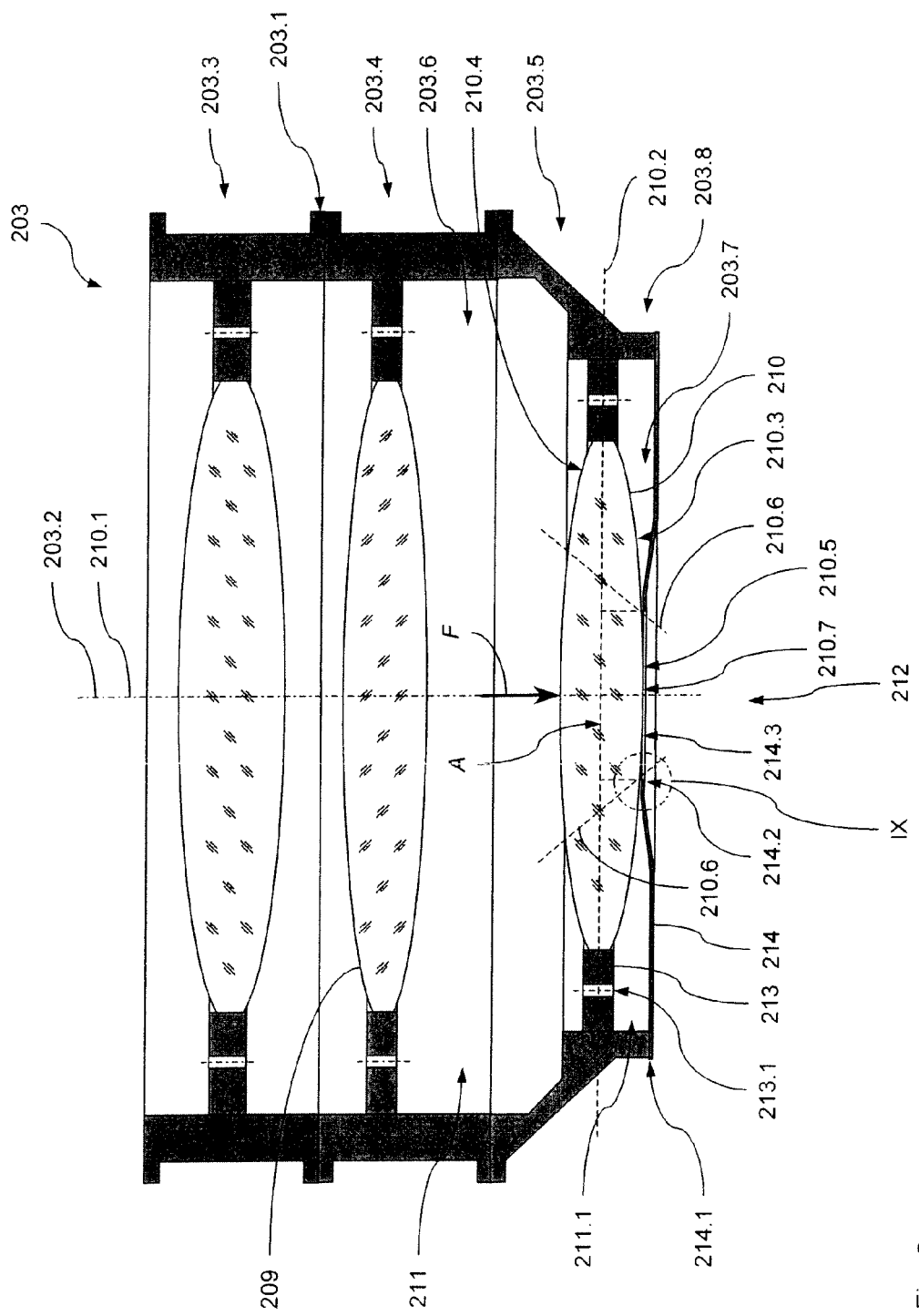
FIG. 8 is a schematic sectional representation of a part of the optical element unit of the optical exposure apparatus of FIG. 7.

FIG. 8 shows a schematic sectional representation of the last three optical element modules 203.3, 203.4 and 203.5 of the optical element unit 203. As can be seen in particular from this Figure, the housing 203.1 has an inner housing part 203.6 partly defining a first space 211 and a light passageway 203.7 between the inner housing part 203.6 and a second space 212 open to the environment surrounding the housing 203.1. While a first pressure prevails in the first space 211, a second pressure prevails in the second space 212.

Within this light passageway 203.7, located at the exit end 203.8 of the optical element unit 203, an ultimate optical element in the form of a last lens element 210 is held by an ultimate optical element holder in the form of a last lens element holder 213 so as to be adjustable in position. This last lens element 210 partly separates the first space 211 and the second space 212 and, thus, partly defines the first space 211 and the second space 212.

The last lens element 210 is a rotationally symmetric lens having a first axis of symmetry 210.1 essentially coinciding with the optical axis 203.2 of the optical element unit 203. The last lens element 210 mainly extends in a first plane perpendicular to the first axis of symmetry 210.1, as it is indicated in FIG. 8 by the dashed line 210.2. Furthermore, the last lens element 210 has a first perpendicular projection onto the first plane 210.2 which has a first area A1.

The last lens element 210 has a first optical element surface in the form of a first lens surface 210.3 and a second optical element surface in the form of a second lens surface 210.4. The first lens surface 210.3 faces away from the penultimate optical element 209 of the optical element group 207. The second lens surface 210.4 faces towards the penultimate optical element 209 of the optical element group 207.

The first lens surface 210.3 has a first surface region 210.5 optically used during an exposure process. This first surface region 210.5 is of circular shape. The outer circumference of the first surface region 210.5 is indicated in FIG. 202 by the intersection of the dashed lines 210.6 with the first lens surface 210.3.

On the side of the last lens element 210 facing away from the penultimate optical element 209, a cover device in the form of a thin walled cover 214 is provided. This cover 214 in its central part substantially has the form of a truncated conical shell. At its outer circumference 214.1, the thin walled cover 214 is mounted to the housing 203.1 in a substantially pressure tight manner.

A third space 211.1 is defined by the housing 203.1, the last lens element holder 213, the last lens element 210 and the cover 214. This third space 211.1 communicates with the inner housing part 203.6 on the other side of the last lens element holder 213 via venting openings 213.1 within the last lens element holder 213. Thus, the third space 211.1 forms part of the first space 211, the first pressure also prevailing in the third space 211.1.

In this context, it will be appreciated that, with other embodiments of the present invention, the venting openings or venting passageways, additionally or alternatively, may also be provided in the housing and the ultimate optical element, respectively.

The cover 214 extends between the housing 203.1 and the last lens element 210. At its inner circumference 214.2, the cover 214 is located immediately adjacent to the first lens surface 210.3, thereby forming an aperture 214.3 at this inner circumference 214.2. This aperture 214.3 leaves a certain part of the first lens surface 210.3 uncovered by the cover 214.

Figure 9:
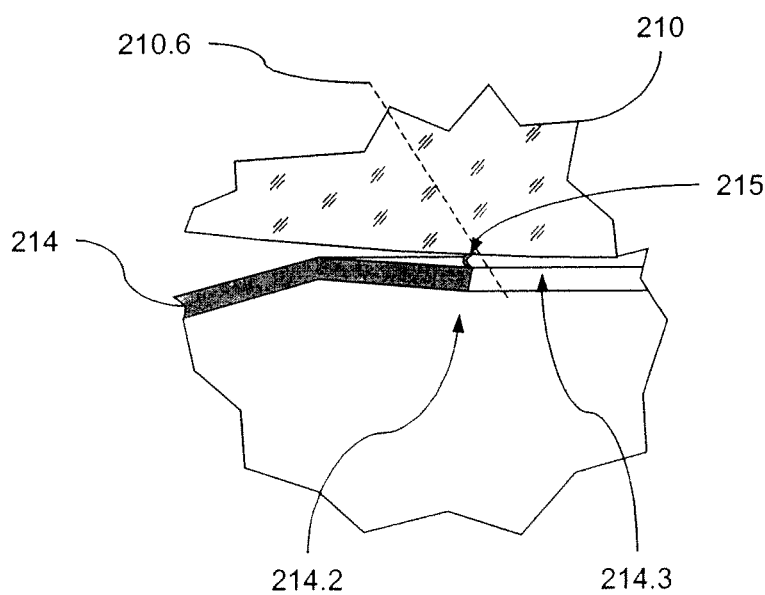
FIG. 9 is a schematic sectional view of the detail IX of FIG. 8.

The cover 214 is not contacting the last lens element 210 directly, as can be seen from FIG. 9 in greater detail. In the embodiment shown, the cover 214 contacts the last lens element 210 via a sealing element in the form of a thin sealing membrane 215. This sealing membrane 215 extends between the inner circumference 214.2 of the cover 214 and the last lens element 210. The sealing membrane 215 is connected to the cover 214 and the last lens element 210 in a pressure tight manner.

Thus, the first space 211 and the second space 212 are separated by the cover 214, the sealing membrane 215 and the last lens element 210 in a pressure tight manner to avoid contamination of the first space 211 with contaminants from the environment surrounding the housing.

The cover 214 is located such that a first part of the last lens element 210 partly defines the first space 211 and that a second part of the last lens element 210 partly defines the second space 212. The perpendicular projection of this first part of the last lens element 210 onto the first plane 210.2 is larger than the perpendicular projection of this second part of the last lens element 210 onto the first plane 210.2.

The cover 214 has the beneficial effect that only a second surface region 210.7 of the first lens surface 210.3 is subjected to the second pressure prevailing in the second space 212 while the rest of the lens surface is subjected to the first pressure prevailing in the first space 211. The outer circumference of this second surface region 210.7 is defined by the sealing membrane 215 contacting the first lens surface 210.3.

Thus, the force F acting in the direction of the optical axis 203.2 on the last lens element 210 in the direction of the optical axis 203.2 due to pressure differences between the first pressure $p_1$ in the first space 211 and the second pressure $p_2$ in the second space 212 may be calculated according to equation (1), i.e. as follows:

$$F = A_{ssr} \cdot (p_1 - p_2) = A_{ssr} \cdot dp,$$

wherein: $A_{ssr}$ is the area of the perpendicular projection of the second surface region 210.7 onto the first plane 210.2;
dp is the pressure difference between the first pressure $p_1$ in the first space 211
and the second pressure $p_2$ in the second space 212.

Consequently, a variation $\Delta dp$ in the pressure difference dp will result in a variation $\Delta F$ in the force F which calculates according to equation (2), i.e. as follows:

$$\Delta F = A_{ssr} \cdot \Delta dp.$$

As becomes apparent from equation (2), compared to a conventional design without a cover 214, the cover 214 considerably reduces the variation $\Delta F$ in the force F acting on the last lens element 210 due to a variation $\Delta dp$ in the pressure difference dp between the first space 211 and the second space 212.

Thus, compared to a conventional design without a cover 214, at a given pressure variation $\Delta dp$ and a given rigidity of the last lens element holder 213 in the direction of the optical axis 203.2 a lower position variation of the last lens element 210 due to this variation Δdp is achieved with the cover 214 according to the invention. Thus, the cover 214 with the sealing membrane 215 forms a load relieving device relieving the last lens element 210 from loads resulting from pressure differences within the first space 211 and the second space 212.

As a consequence, to keep certain position variation limits for the last lens element 210 during operation, less effort is required for the rigidity of the last lens element holder 213 in the direction of the optical axis.

It will be appreciated that, to achieve this beneficial effect according to the invention, the aperture 214.3 has a second perpendicular projection onto the first plane 210.2 with a second area $A_2$ which is smaller than the first area $A_1$ of the first perpendicular projection of the last lens element 210 onto the first plane 210.2.

To largely take advantage of this beneficial effect without affecting the optical performance of the optical system, the aperture 214.3 is located as close as possible to the first surface region 210.5 optically used during an exposure process, as it is shown in the FIGS. 8 and 9. Thus, the second area $A_2$ substantially corresponds to of the third perpendicular projection of the first surface region 210.5 onto the first plane 210.2.

In other words, the aperture 214.3 is located as close as possible to the first surface region 210.5 optically used during an exposure process such as to leave uncovered only the first surface region 210.5 while covering the rest of the first surface 210.3.

It will be appreciated that, with other embodiments of the present invention, the first surface region optically used may be smaller than the aperture provided by the cover. Thus, the third area $A_3$ may be smaller than the second area $A_2$. Anyway, preferably, the third area $A_3$ corresponds to at least 80% of the second area $A_2$.

In other words, the aperture may leave uncovered a part of the first surface which is larger than the first surface region optically used and which is including the first surface region optically used. Anyway, preferably, the first surface region optically used corresponds to at least 80% of the part of the first surface left uncovered by the aperture.

Figure 7:
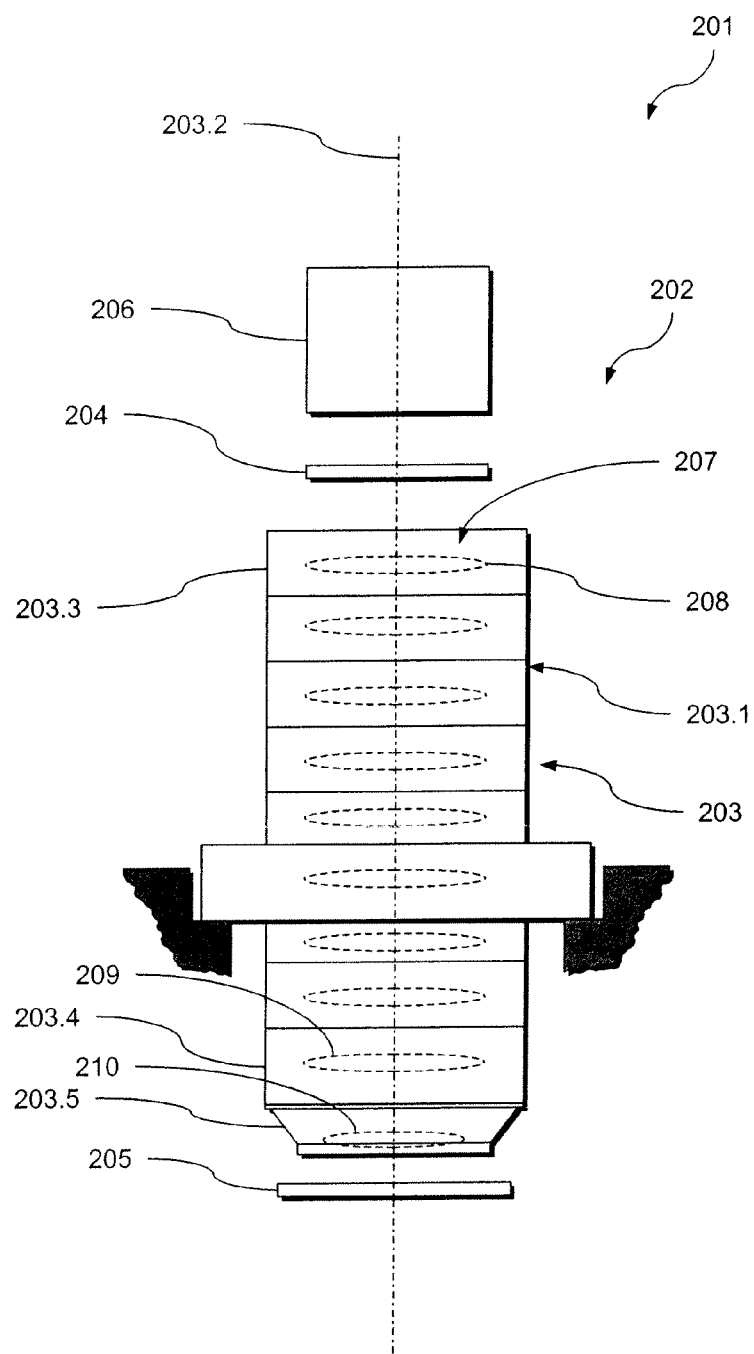
FIG. 7 is a schematic representation of a further preferred embodiment of an optical exposure apparatus according to the present invention comprising a preferred embodiment of an optical element unit according to the present invention.

It will be further appreciated that, the embodiment of FIGS. 7 to 9 allows for a greater relief of the last lens element 210 from loads resulting from pressure differences within the first space 211 and the second space 212 than the embodiment shown in FIGS. 1 to 3. This is due to the fact that the first surface region 210.5 optically used during an exposure process is smaller than the first surface region 10.5 optically used with the embodiment shown in FIGS. 1 to 3. This allows for an smaller aperture 214.3 which is smaller than the aperture 14.3, leading to a further reduction in the force F acting in the direction of the optical axis 203.2 on the last lens element 210 due to pressure differences between the first space 211 and the second space 212.

The cover 214 is formed by a thin sheet metal. Anyway, it will be appreciated that, with other embodiments of the present invention, the cover may also be formed by one or more layers of metal and/or of different materials such as composite materials, plastics, ceramics, glass and any combination thereof.

The cover 214 has a rigidity in the direction of the optical axis which is sufficient to prevent direct contact of the cover 214 with the last lens element 210 under any pressure difference between the first space 211 and the second space 212 that is to be expected during normal use of the optical element unit 203. Anyway, the cover 214, within the limitations stated above, may undergo deformations. Thus, the cover 214 may be of very simple and lightweight design occupying relatively few space.

Since the cover 214 is a part mounted separately to the housing 203.1, the distance between the last lens element 210 and the inner circumference of the cover may easily be adjusted to the specific requirements of the respective application. Furthermore, it will be appreciated that either one of the cover 214 and the last lens element 210 may be adapted in geometry and surface properties, respectively, to provide appropriate or optimized sealing boundaries within the gap between them.

The sealing membrane 215 allows for relative motions between the cover 214 and the last lens element 210 caused by such variations in the pressure difference between the first space 211 and the second space 212.

It will be appreciated that, with other embodiments of the present invention, instead of the sealing membrane 215, another type of elastic sealing element or sealing substance, such as an elastic glue or the like, may be located between the cover and the last lens element. Furthermore, a substantially rigid connection between the cover and the last lens element may be chosen, provided that the cover in itself is of sufficient rigidity in the direction of the optical axis so as to not transfer a substantial part of the loads resulting from pressure differences between the first and second space onto the ultimate optical element.

It will be further appreciated that, with other embodiments of the invention, instead of the sealing membrane 215, a sealing gap may be formed between the cover and the last lens element as it has been described above in the context of FIGS. 5 and 6.

It will be further appreciated that, with other embodiments of the invention, instead of the pressure tight connection between the housing 203.1 and the cover 214, a connection with a narrow sealing gap as described above in the context of FIGS. 5 and 6 may be provided.

It will be further appreciated that the optical element unit 203 of FIGS. 7 to 9 may be manufactured with a method according to the invention as it has been described above with reference to FIG. 4.

Fourth Embodiment

In the following, a fourth preferred embodiment of an optical exposure apparatus 301 according to the present invention comprising an optical projection system 302 with an optical element unit 303 according to the present invention will be described with reference to FIGS. 10 and 11.

The optical exposure apparatus 301 is adapted to transfer an image of a pattern formed on a mask 304 onto a substrate 305. To this end, the optical exposure apparatus 301 comprises an illumination system 306 illuminating the mask 304 and the optical element unit 303. The optical element unit 303 projects the image of the pattern formed on the mask 4 onto the substrate 305, e.g. a wafer or the like.

To this end, the optical element unit 303 holds an optical element group 307. This optical element group 307 is held within a housing 303.1 of the optical element unit 303. The optical element group 307 comprises a number of optical elements 308 and optical elements 309 and 310, such as lenses, mirrors or the like. These optical elements 308, 309, 310 are aligned along an optical axis 303.2 of the optical element unit 303.

The optical projection system 302 receives the part of the light path between the mask 304 and the substrate 305. Its optical elements 308, 309, 310 cooperate to transfer the image of the pattern formed on the mask 304 onto the substrate 305 located at the end of the light path. To this end, the optical elements 308, 309, 310 of the optical element group 307 project the light received form the illumination system 306 along the optical axis 303.2.

The optical element unit 303 is composed of a plurality of optical element modules 303.3 and optical element modules 303.4 and 303.5 stacked and tightly connected to form the optical exposure unit 303. Each optical element module 303.3, 303.4, 303.5 holds one or more of the optical elements 308, 309, 310, respectively.

The optical exposure apparatus 301 further comprises a heat exchange unit 317 for heating or cooling parts of the optical element unit 303. The heat exchange unit 317 comprises a cylindrical heat exchanger shell 317.1 surrounding parts of the optical element unit 303 and a heat exchanging medium source 317.2 connected thereto. The cylindrical shell 317.1 contains the ducts for distributing the heat exchanging medium coming from the heat exchanging medium source 317.2. In the embodiment shown, flow of a gaseous heat exchanging medium is established within the space between the heat exchanger shell 317.1 and the optical element unit 303.

It will be appreciated that the heat exchanger shell 317.1 may only be associated to a part of the optical element unit 303. Anyway, it is also possible that the cylindrical shell 317.1 envelopes the entire optical element unit 303. Furthermore, it will be appreciated that the heat exchange unit 317 may cool certain parts of the optical element unit 303 while heating other parts of the optical element unit 303 at the same time. To this end different loops of one or different heat exchanging media may be provided.

Figure 11:
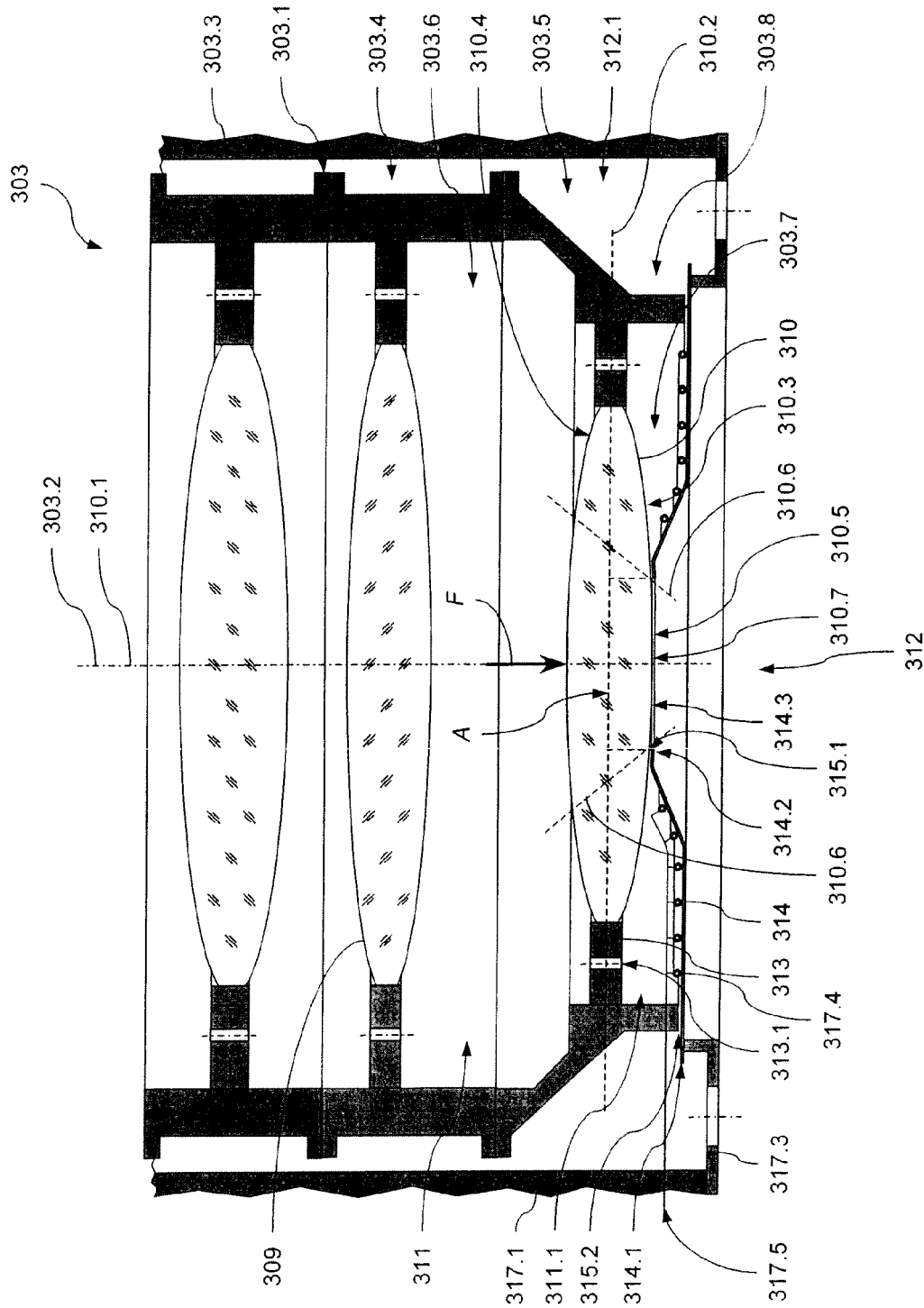
FIG. 11 is a schematic sectional representation of a part of the optical element unit of the optical exposure apparatus of FIG. 10.

FIG. 11 shows a schematic sectional representation of the last three optical element modules 303.3, 303.4 and 303.5 of the optical element unit 303. As can be seen in particular from this Figure, the housing 303.1 has an inner housing part 303.6 partly defining a first space 311 and a light passageway 303.7 between the inner housing part 303.6 and a second space 312 open to the environment surrounding the heat exchanger shell 317.1 and, thus, the housing 303.1. While a first pressure prevails in the first space 311, a second pressure prevails in the second space 312.

Within this light passageway 303.7, located at the exit end 303.8 of the optical element unit 303, an ultimate optical element in the form of a last lens element 310 is held by an ultimate optical element holder in the form of a last lens element holder 313 so as to be adjustable in position. This last lens element 310 partly separates the first space 311 and the second space 312 and, thus, partly defines the first space 311 and the second space 312.

The last lens element 310 is a rotationally symmetric lens having a first axis of symmetry 310.1 essentially coinciding with the optical axis 303.2 of the optical element unit 303. The last lens element 310 mainly extends in a first plane perpendicular to the first axis of symmetry 310.1, as it is indicated in FIG. 11 by the dashed line 310.2. Furthermore, the last lens element 310 has a first perpendicular projection onto the first plane 310.2 which has a first area A1.

The last lens element 310 has a first optical element surface in the form of a first lens surface 310.3 and a second optical element surface in the form of a second lens surface 310.4. The first lens surface 310.3 faces away from the penultimate optical element 309 of the optical element group 307. The second lens surface 310.4 faces towards the penultimate optical element 309 of the optical element group 307.

The first lens surface 310.3 has a first surface region 310.5 optically used during an exposure process. This first surface region 310.5 is of circular shape. The outer circumference of the first surface region 310.5 is indicated in FIG. 10 by the intersection of the dashed lines 310.6 with the first lens surface 310.3.

On the side of the last lens element 310 facing away from the penultimate optical element 309, a cover device in the form of a thin walled cover 314 is provided. This cover 314 in its central part substantially has the form of a truncated conical shell. At its outer circumference 314.1, the thin walled cover 314 is mounted to the heat exchanger shell 317.1 via an open flange 317.3 of the heat exchanger shell 317.1. Anyway, it will be appreciated that, with other embodiments of the invention, the cover may also be mounted to any adjacent support structure other than the heat exchanger shell.

A third space 311.1 is defined by the housing 303.1, the last lens element holder 313, the last lens element 310 and the cover 314. This third space 311.1 communicates with the inner housing part 303.6 on the other side of the last lens element holder 313 via venting openings 313.1 within the last lens element holder 313. Thus, the third space 311.1 forms part of the first space 311, the first pressure also prevailing in the third space 311.1.

In this context, it will be appreciated that, with other embodiments of the present invention, the venting openings or venting passageways, additionally or alternatively, may also be provided in the housing and the ultimate optical element, respectively.

A fourth space 312.1 is defined by the housing 303.1, the cover 314, the flange 317.3 and the heat exchanger shell 317.1. This fourth space 312.1 communicates with the environment of the heat exchanger shell 317.1 via venting openings within the flange 317.3. Thus, the fourth space 312.1 forms part of the second space 312, the second pressure also substantially prevailing in the fourth space 312.1.

The cover 314 extends between the heat exchanger shell 317.1 and the last lens element 310. At its inner circumference 314.2, the cover 314 is located immediately adjacent to the first lens surface 310.3, thereby forming an aperture 314.3 at this inner circumference 314.2. This aperture 314.3 leaves a certain part of the first lens surface 310.3 uncovered by the cover 314.

The cover 314 is not contacting the last lens element 310. In the embodiment shown, similar to the embodiment shown in FIG. 6, a first sealing gap 315.1 is formed between the inner circumference 314.2 of the cover 314 and the last lens element 310. Furthermore, a similar second sealing gap 315.2 is formed between the housing 303.1 and the cover 314.

To avoid contamination of the first space 311 with contaminants from the environment surrounding the heat exchanger shell 317.1 and the housing 313, respectively, the first pressure in the first space 311 is kept slightly superior to the second pressure in the second space 312. This is achieved by a pressurizing unit—not shown—connected to the first space 311. Thus, a slight flow of the gas the first space 311 is filled with is maintained through the first sealing gap 315.1 and the second sealing gap 315.2 towards the second space 312.

Both sealing gaps 315.1 and 315.2 have the advantage that axial and radial errors in positioning the cover 314 do substantially not influence the sealing performance and, in particular, do not influence the positioning of the last lens element 310.

The cover 314 is located such that a first part of the last lens element 310 partly defines the first space 311 and that a second part of the last lens element 310 partly defines the second space 312. The perpendicular projection of this first part of the last lens element 310 onto the first plane 310.2 is larger than the perpendicular projection of this second part of the last lens element 310 onto the first plane 310.2.

The cover 314 has the beneficial effect that only a second surface region 310.7 of the first lens surface 310.3 is subjected to the second pressure prevailing in the second space 312 while the rest of the lens surface is subjected to the first pressure prevailing in the first space 311. The outer circumference of this second surface region 310.7 is defined by the sealing membrane 315 contacting the first lens surface 310.3.

Thus, the force F acting in the direction of the optical axis 303.2 on the last lens element 310 in the direction of the optical axis 303.2 due to pressure differences between the first pressure $p_1$ in the first space 311 and the second pressure $p_2$ in the second space 312 may be calculated according to equation (1), i.e. as follows:

$$F = A_{ssr} \cdot (p_1 - p_2) = A_{ssr} \cdot dp,$$

wherein: $A_{ssr}$, is the area of the perpendicular projection of the second surface region 310.7 onto the first plane 310.2;
dp is the pressure difference between the first pressure $p_1$ in the first space 311
and the second pressure $p_2$ in the second space 312.

Consequently, a variation $\Delta dp$ in the pressure difference dp will result in a variation $\Delta F$ in the force F which calculates according to equation (2), i.e. as follows:

$$\Delta F = A_{ssr} \cdot \Delta dp.$$

As becomes apparent from equation (2), compared to a conventional design without a cover 314, the cover 314 considerably reduces the variation $\Delta F$ in the force F acting on the last lens element 310 due to a variation $\Delta dp$ in the pressure difference dp between the first space 311 and the second space 312.

Thus, compared to a conventional design without a cover 314, at a given pressure variation $\Delta dp$ and a given rigidity of the last lens element holder 313 in the direction of the optical axis 303.2 a lower position variation of the last lens element 310 due to this variation $\Delta dp$ is achieved with the cover 314 according to the invention. Thus, the cover 314 forms a load relieving device relieving the last lens element 310 from loads resulting from pressure differences within the first space 311 and the second space 312.

As a consequence, to keep certain position variation limits for the last lens element 310 during operation, less effort is required for the rigidity of the last lens element holder 313 in the direction of the optical axis.

It will be appreciated that, to achieve this beneficial effect according to the invention, the aperture 314.3 has a second perpendicular projection onto the first plane 310.2 with a second area $A_2$ which is smaller than the first area $A_1$ of the first perpendicular projection of the last lens element 310 onto the first plane 310.2.

To largely take advantage of this beneficial effect without affecting the optical performance of the optical system, the aperture 314.3 is located as close as possible to the first surface region 310.5 optically used during an exposure process, as it is shown in FIG. 11. Thus, the second area $A_2$ substantially corresponds to of the third perpendicular projection of the first surface region 310.5 onto the first plane 310.2.

In other words, the aperture 314.3 is located as close as possible to the first surface region 310.5 optically used during an exposure process such as to leave uncovered only the first surface region 310.5 while covering the rest of the first surface 310.3.

It will be appreciated that, with other embodiments of the present invention, the first surface region optically used may be smaller than the aperture provided by the cover. Thus, the third area $A_3$ may be smaller than the second area $A_2$. Anyway, preferably, the third area $A_3$ corresponds to at least 80% of the second area $A_2$.

In other words, the aperture may leave uncovered a part of the first surface which is larger than the first surface region optically used and which is including the first surface region optically used. Anyway, preferably, the first surface region optically used corresponds to at least 80% of the part of the first surface left uncovered by the aperture.

Figure 10:
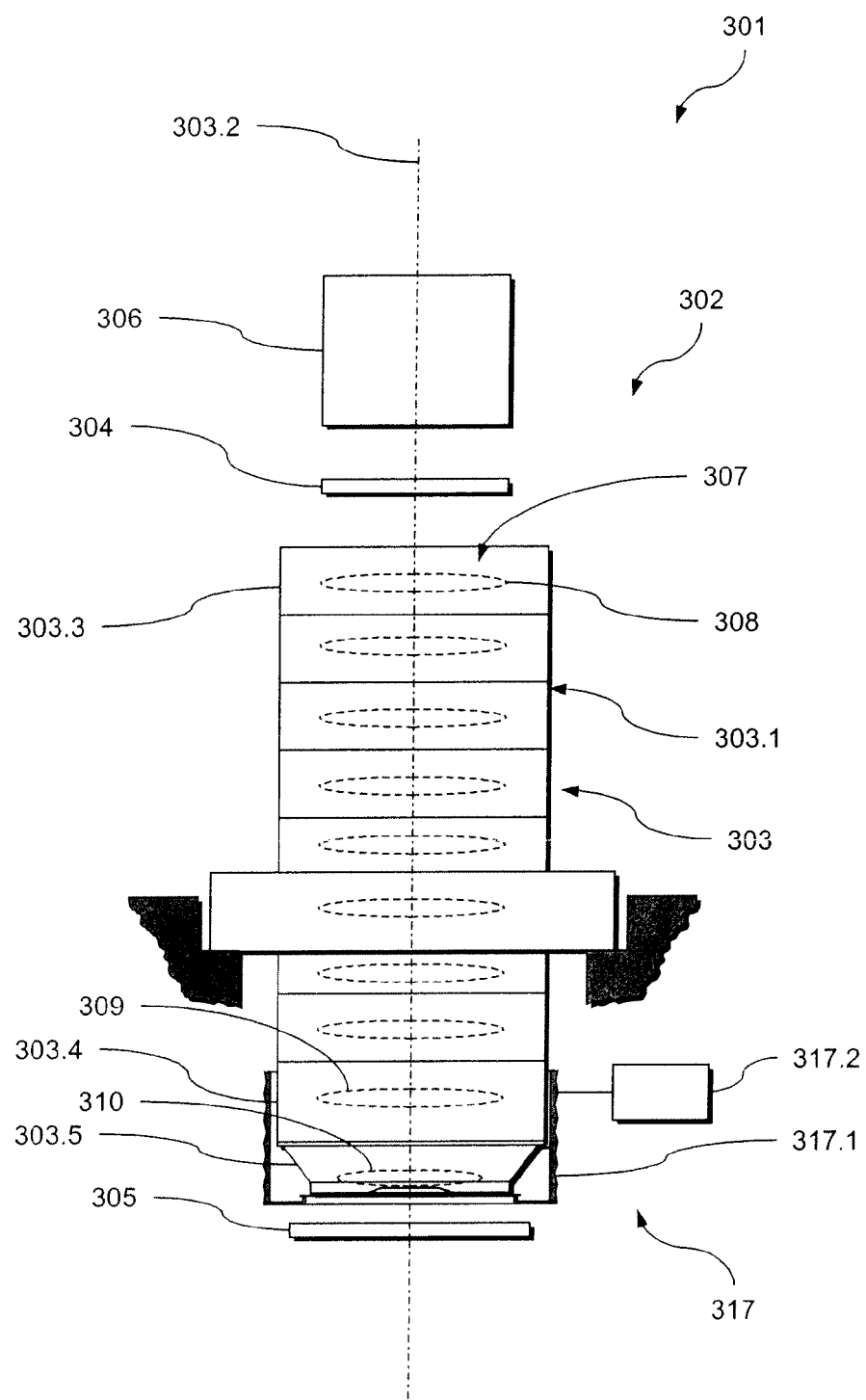
FIG. 10 is a schematic representation of a further preferred embodiment of an optical exposure apparatus according to the present invention comprising a preferred embodiment of an optical element unit according to the present invention.

It will be further appreciated that, the embodiment of FIGS. 10 and 11 as well allows for a greater relief of the last lens element 310 and the last lens element holder 313 from loads resulting from pressure differences within the first space 311 and the second space 312 than the embodiment shown in FIGS. 1 to 3. This is due to the fact that the first surface region 310.5 optically used during an exposure process is smaller than the first surface region 10.5 optically used with the embodiment shown in FIGS. 1 to 3. This allows for an smaller aperture 314.3 which is smaller than the aperture 14.3, leading to a further reduction in the force F acting in the direction of the optical axis 303.2 on the last lens element 310 due to pressure differences between the first space 311 and the second space 312.

The cover 314 is formed by a thin sheet metal. Anyway, it will be appreciated that, with other embodiments of the present invention, the cover may also be formed by one or more layers of metal and/or of different materials such as composite materials, plastics, ceramics, glass and any combination thereof.

The cover 314 has a rigidity in the direction of the optical axis which is sufficient to prevent direct contact of the cover 314 with the last lens element 310 under any pressure difference between the first space 311 and the second space 312 that is to be expected during normal use of the optical element unit 303. Anyway, the cover 314, within the limitations stated above, may undergo deformations. Thus, the cover 314 may be of very simple and lightweight design occupying relatively few space.

Since the cover 314 is a part mounted separately to the heat exchanger shell 317.1, the distance between the last lens element 310 and the inner circumference of the cover 314 may easily be adjusted to the specific requirements of the respective application. Furthermore, it will be appreciated that either one of the cover 314 and the last lens element 310 may be adapted in geometry and surface properties, respectively, to provide appropriate or optimized sealing boundaries within the gap between them.

The sealing gaps 315.1 and 315.2 allow for relative motions between the cover 314 and the last lens element 310 caused by such variations in the pressure difference between the first space 311 and the second space 312.

It will be further appreciated that, with other embodiments of the invention, instead of the narrow sealing gaps 315.1 and 315.2, a pressure tight connection, e.g. a sealing membrane, between the cover 314 and the last lens element 310 and the housing 303.1, respectively, may be provided as it has been described above in the context of FIGS. 2 and 3.

On the side of the cover 314 facing towards the last lens element 310 there is mounted a set of circular first heat exchange medium lines 317.4. These first heat exchange medium lines 317.4 form part of the heat exchange unit 317. They are fed with heat exchange medium via a second heat exchange medium line 317.5 connected to the heat exchanging medium source 317.2. Depending on the respective requirements of the application, the first heat exchange medium lines 317.4 may be fed with heating or cooling medium in order to heat or cool their surroundings. Of course, the heat exchange medium lines may also be integrated into the cover.

It will be appreciated that, with other embodiments of the invention, the first heat exchange medium lines may also be located on the other side of the cover. In general, it is preferred to locate such heat exchange medium lines on the side where the heat exchange effect is needed most.

Furthermore, instead of providing separate heat exchange medium lines the cover itself may be a part of the heat exchange unit by providing a sufficient heat conduction towards and/or from the heat exchanger shell. To this end, elements enhancing heat transfer performance, such as heat transfer ribs or the like, may be provided on the cover instead of the first heat exchange medium lines 317.4.

It will be further appreciated that such a heat exchange unit may also be provided with any other embodiment of the invention having a cover covering part of the ultimate optical element arrangement, in particular covering part of the ultimate optical element.

Finally, it will be appreciated that the optical element unit 303 of FIGS. 10 and 11 may be manufactured with a method according to the invention as it has been described above with reference to FIG. 4.

Fifth Embodiment

In the following, a fifth preferred embodiment of an optical exposure apparatus 401 according to the present invention comprising an optical projection system 402 with an optical element unit 403 according to the present invention will be described with reference to FIGS. 12 and 13.

The optical exposure apparatus 401 is adapted to transfer an image of a pattern formed on a mask 404 onto a substrate 405. To this end, the optical exposure apparatus 401 comprises an illumination system 406 illuminating the mask 404 and the optical element unit 403. The optical element unit 403 projects the image of the pattern formed on the mask 4 onto the substrate 405, e.g. a wafer or the like.

To this end, the optical element unit 403 holds an optical element group 407. This optical element group 407 is held within a housing 403.1 of the optical element unit 403. The optical element group 407 comprises a number of optical elements 408 and optical elements 409 and 410, such as lenses, mirrors or the like. These optical elements 408, 409, 410 are aligned along an optical axis 403.2 of the optical element unit 403.

The optical projection system 402 receives the part of the light path between the mask 404 and the substrate 405. Its optical elements 408, 409, 410 cooperate to transfer the image of the pattern formed on the mask 404 onto the substrate 405 located at the end of the light path. To this end, the optical elements 408, 409, 410 of the optical element group 407 project the light received form the illumination system 406 along the optical axis 403.2.

The optical element unit 403 is composed of a plurality of optical element modules 403.3 and optical element modules 403.4 and 403.5 stacked and tightly connected to form the optical exposure unit 403. Each optical element module 403.3, 403.4, 403.5 holds one or more of the optical elements 408, 409, 410, respectively.

Figure 13:
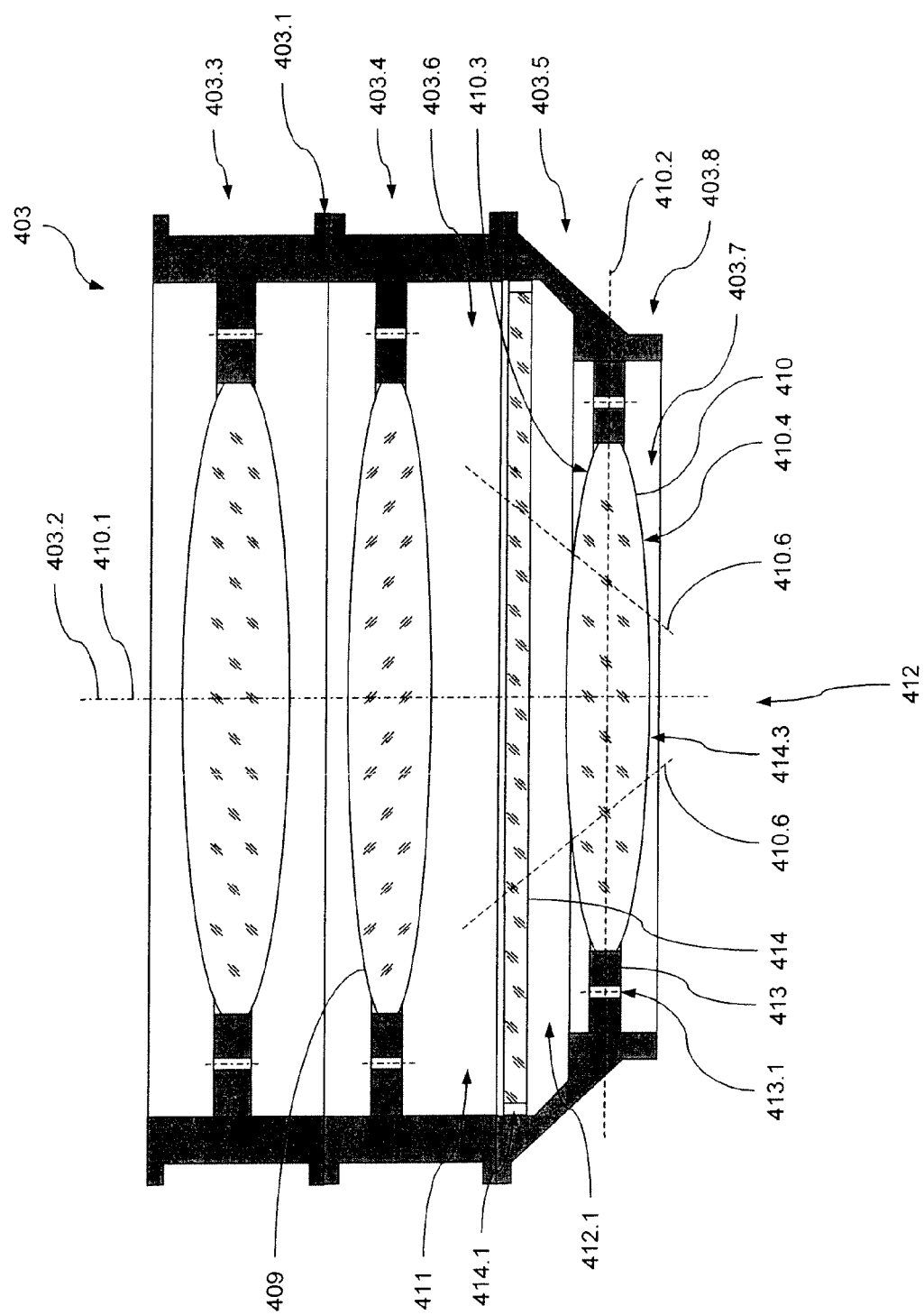
FIG. 13 is a schematic sectional representation of a part of the optical element unit of the optical exposure apparatus of FIG. 12.

FIG. 13 shows a schematic sectional representation of the last three optical element modules 403.3, 403.4 and 403.5 of the optical element unit 403. As can be seen in particular from this Figure, the housing 403.1 has an inner housing part 403.6 partly defining a first space 411 and a light passageway 403.7 between the inner housing part 403.6 and a second space 412 open to the environment surrounding the housing 403.1. While a first pressure prevails in the first space 411, a second pressure prevails in the second space 412.

Within this light passageway 403.7, located at the exit end 403.8 of the optical element unit 403, an ultimate optical element in the form of a last lens element 410 is held by an ultimate optical element holder in the form of a last lens element holder 413 so as to be adjustable in position.

The last lens element 410 is a rotationally symmetric lens having a first axis of symmetry 410.1 essentially coinciding with the optical axis 403.2 of the optical element unit 403. The last lens element 410 mainly extends in a first plane perpendicular to the first axis of symmetry 410.1, as it is indicated in FIG. 13 by the dashed line 410.2.

The last lens element 410 has a first optical element surface in the form of a first lens surface 410.3 and a second optical element surface in the form of a second lens surface 410.4. The first lens surface 410.3 faces towards the penultimate optical element 409 of the optical element group 407. The second lens surface 410.4 faces away from the penultimate optical element 409 of the optical element group 407.

On the side of the last lens element 410 facing towards the penultimate optical element 409, a sealing device in the form of a plane parallel plate 414 is provided within the inner part 403.6 of the housing 401.1.

A third space 412.1 is defined by the housing 403.1, the last lens element holder 413, the last lens element 410 and the plane parallel plate 414. This third space 412.1 communicates with the environment surrounding the housing 403.1 on the other side of the last lens element holder 413 via venting openings 413.1 within the last lens element to holder 413. Thus, the third space 412.1 forms part of the second space 412, the second pressure also prevailing in the third space 412.1.

In this context, it will be appreciated that, with other embodiments of the present invention, the venting openings or venting passageways, additionally or alternatively, may also be provided in the housing and the ultimate optical element, respectively.

At its outer circumference 414.1, the plane parallel plate 414 is mounted to the housing 403.1 in a substantially pressure tight manner. Thus, the first space 411 and the second space 412 are separated by the plane parallel plate 414 in a pressure tight manner to avoid contamination of the first space 411 with contaminants from the environment surrounding the housing.

The plane parallel plate 414 is a translucent element made of glass. Anyway, it will be appreciated that, with other embodiments of the present invention, the sealing device may also only have a translucent section in the region where useful light is crossing the location of the sealing device during an exposure process. In other words, the translucent section may be limited to the region optically used during an exposure process. The outer circumference of such a translucent section is indicated in FIG. 13 by the intersection of the dashed lines 410.6 with the plane parallel plate 414, the dashed lines 410.6 representing the region optically used during an exposure process.

The plane parallel plate 414 introduces a shift into the image produced by the lens elements 408, 409 and 410 of the optical element group 407. This has to be accounted for when designing the optical element group 407. Thus, the plane parallel plate 414 represents a further optical element of the optical element group 407.

The plane parallel plate 414 is resiliently mounted to the housing, such that it may undergo excursions along the optical axis 403.2. In the embodiment shown, the mounting mechanism provides a parallel guide to the plane parallel plate 414 such that it does not undergo any tilting with respect to the optical axis 403.2. Due to the change in volume it provides, this resilient mounting mechanism also reduces the deformation of the plane parallel plate 414. Thus, the plane parallel plate 414 is optically insensitive to such excursions along the optical axis 403.2, leading to substantially no alterations in the image produced by the optical element group 407.

Anyway, it will be appreciated that, with other embodiments of the invention, instead of a parallel guide, any other suitable mounting mechanism may chosen providing a corresponding support to the sealing device. In particular, the sealing device may simply be glued to the housing with one or more layers of, preferably elastic, glue.

Furthermore, it will be appreciated that, with other embodiments of the invention, instead of the plane parallel plate 414, any other suitable optical element of different shape may be provided for forming the translucent section. It is only preferred that such an element is similarly optically insensitive to excursions along the optical axis 403.2, leading to substantially no alterations in the image produced by the optical element group 407.

The plane parallel plate 414 has the beneficial effect that the last lens element 410 and its holder 413 are not subjected to any loads resulting from pressure differences between the first space 411 and the second space 412. These loads are completely taken by the plane parallel plate 414 substantially without affecting the quality of the image produced by the optical element group 407. Thus, the plane parallel plate 414 forms a load relieving device completely relieving the last lens element 410 from loads resulting from pressure differences within the first space 411 and the second space 412.

As a consequence, to keep certain position variation limits for the last lens element 410 during operation, considerably less effort is required for the rigidity of the last lens element holder 413 in the direction of the optical axis.

As stated above, the plane parallel plate 414 is made of glass. Anyway, as also mentioned above, it will be appreciated that, with other embodiments of the present invention, only a translucent section within the sealing device may be provided. This translucent section may be held by a suitable holder. This holder may be made of metal and/or of different materials such as composite materials, plastics, ceramics, glass and any combination thereof.

It will be further appreciated that, with other embodiments of the invention, instead of the pressure tight connection between the housing 403.1 and the plane parallel plate 414, a connection with a narrow sealing gap as described above in the context of FIGS. 5 and 6 may be provided.

Figure 12:
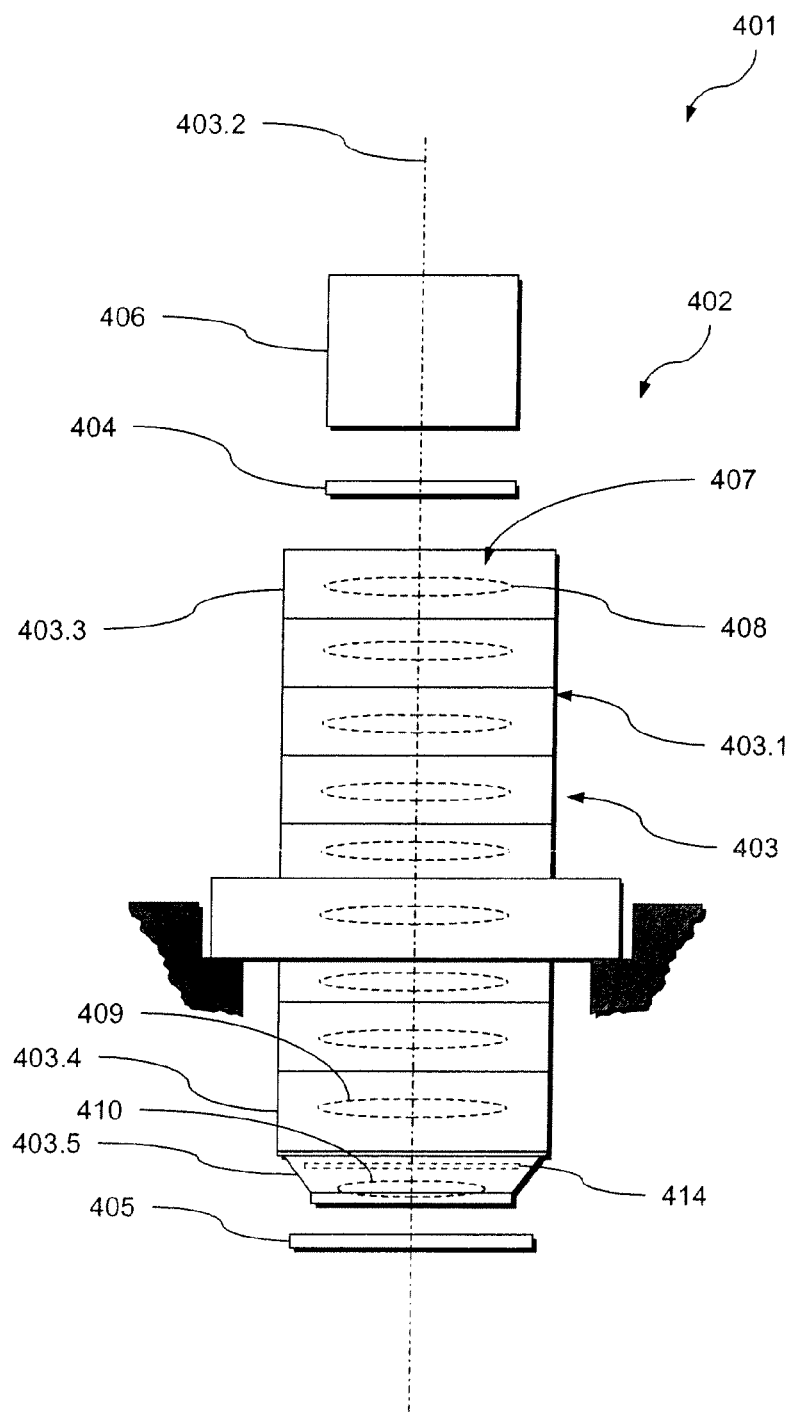
FIG. 12 is a schematic representation of a further preferred embodiment of an optical exposure apparatus according to the present invention comprising a preferred embodiment of an optical element unit according to the present invention.

It will be further appreciated that, with other embodiments of the invention, in cases with very strict requirements with respect to the relief of the ultimate optical element arrangement, the fifth embodiment shown in the FIGS. 12 and 13 may be combined with one of the first to fourth embodiments previously described. In other words, the sealing device of the fifth embodiment may be combined with the cover device of one of the first to fourth embodiments.

Figure 14:
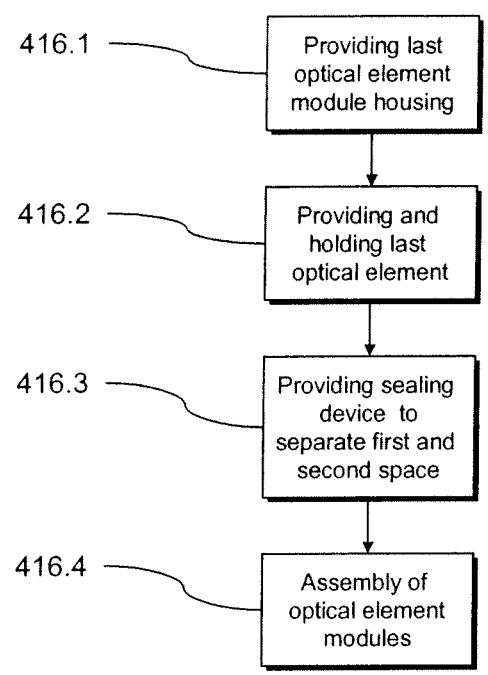
FIG. 14 is a block diagram of a preferred embodiment of a method of manufacturing the optical element unit of FIG. 12 including a preferred embodiment of a method of holding an optical element according to the present invention.

FIG. 14 shows a block diagram of a preferred embodiment of a method of manufacturing the optical element unit 403 of FIG. 12 including a preferred embodiment of a method of holding an optical element according to the present invention.

In a first step 416.1 the housing of the last optical element module 403.5 is provided providing a part of the housing 403.1 and the inner housing part 403.6 partly defining the first space 411 and the light passageway 403.7.

In a second step 4016.2, the last lens element 410 is provided and held in the region of the light passageway 403.7 to provide a configuration as it has been described above in the context of FIGS. 12 and 13.

In a third step 416.3, the first space 411 and the second space 412 are separated by means of the plane parallel plate 414 to provide a configuration as it has been described above in the context of FIGS. 12 and 13. To this end the plane parallel plate 414 is mounted in a pressure tight manner to the part of the housing 403.1 the last optical element module 403.5 provides. Furthermore, the plane parallel plate 414 is connected in a pressure tight manner to the last lens element 410 to provide a configuration as it has been described above in the context of FIGS. 12 and 13.

Finally, in a fourth step 416.4, the other optical element modules 403.3 to 403.4 are provided and the optical element modules 403.3 to 403.5 are assembled to form the optical element unit 403 in order to provide a configuration as it has been described above in the context of FIGS. 12 and 13.

It will be appreciated that the steps 416.1 to 416.3 form part of a preferred embodiment of a method of holding an optical element according to the invention. Furthermore, it will be appreciated that, with other embodiments of the present invention, the above steps may be executed in any suitable different order to achieve the configuration as it has been described above in the context of FIGS. 12 and 13.

Sixth Embodiment

In the following, a sixth preferred embodiment of an optical exposure apparatus according to the present invention will be described with reference to FIGS. 1 and 15. The optical exposure apparatus, apart from the optical element unit 503, is identical with the optical exposure apparatus 1 described with reference to FIGS. 1 to 3. Thus, it will here only be referred to the differences relating to the optical element unit 503.

The optical element unit 503 holds an optical element group. This optical element group is held within a housing 503.1 of the optical element unit 503. The optical element group comprises a number of optical elements including optical elements 508, 509 and 510, such as lenses, mirrors or the like. These optical elements 508, 509, 510 are aligned along an optical axis 503.2 of the optical element unit 503.

The optical element unit 503 is composed of a plurality of optical element modules 503.3 and optical element module 503.4 stacked and tightly connected to form the optical exposure unit 503. Other than with the first embodiment, the ultimate optical element module 503.5 is connected to the penultimate optical element module 503.4 by a set of actuators 517. Each optical element module 503.3, 503.4, 503.5 holds one or more of the optical elements 508, 509, 510, respectively.

Figure 15:
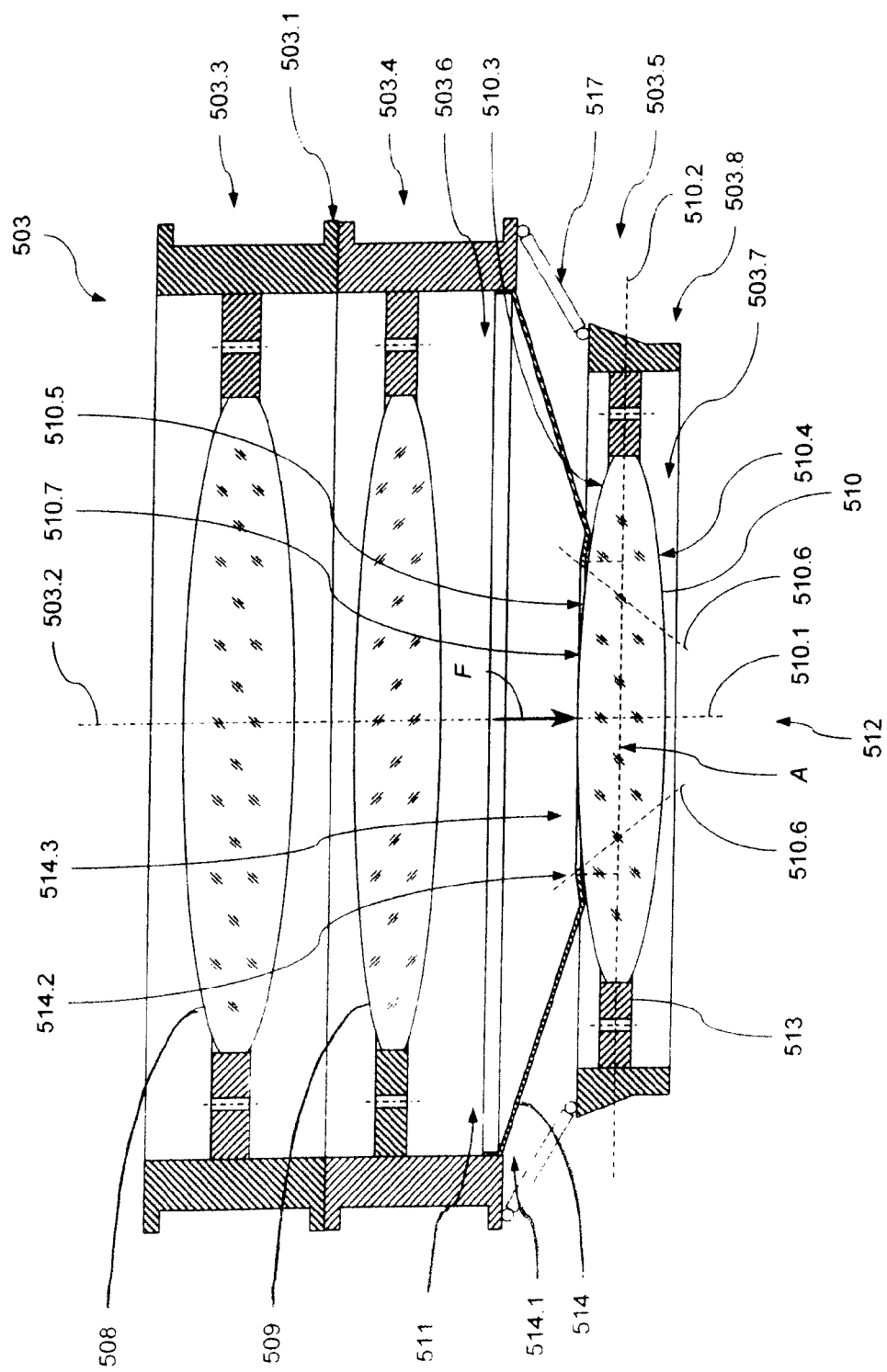
FIG. 15 is a schematic representation of a further preferred embodiment of an optical exposure apparatus according to the present invention comprising a preferred embodiment of an optical element unit according to the present invention.

FIG. 15 shows a schematic sectional representation of the last three optical element modules 503.3, 503.4 and 503.5 of the optical element unit 503. As can be seen in particular from this Figure, the housing 503.1 has an inner housing part 503.6 partly defining a first space 511 and a light passageway 503.7 between the inner housing part 503.6 and a second space 512 open to the environment surrounding the housing 503.1. While a first pressure prevails in the first space 511, a second pressure prevails in the second space 512.

Within this light passageway 503.7, located at the exit end 503.8 of the optical element unit 503, there is provided an ultimate optical element arrangement comprising an ultimate optical element in the form of a last lens element 510 and an ultimate optical element holder in the form of a last lens element holder 513. The last lens element holder 513 is holding the last lens element 510. This last lens element 510 partly separates the first space 511 and the second space 512 and, thus, partly defines the first space 511 and the second space 512. In this embodiment, other than with the first embodiment, the last lens element 510, together with the last lens element holder 513, is adjustable in position via the actuators 517.

The last lens element 510 is a rotationally symmetric lens having a first axis of symmetry 510.1 essentially coinciding with the optical axis 503.2 of the optical element unit 503. The last lens element 510 mainly extends in a first plane perpendicular to the first axis of symmetry 510.1, as it is indicated in FIG. 2 by the dashed line 510.2. Furthermore, the last lens element 510 has a first perpendicular projection onto the first plane 510.2 which has a first area A1.

The last lens element 510 has a first optical element surface in the form of a first lens surface 510.3 and a second optical element surface in the form of a second lens surface 510.4. The first lens surface 510.3 faces towards the penultimate optical element 509 of the optical element group 507. The second lens surface 510.4 faces away from the penultimate optical element 509 of the optical element group 507.

The first lens surface 510.3 has a first surface region 510.5 optically used during an exposure process. This first surface region 510.5 is of circular shape. The outer circumference of the first surface region 510.5 is indicated in FIG. 15 by the intersection of the dashed lines 510.6 with the first lens surface 510.3.

Between the last lens element 510 and the penultimate optical element 509, a cover device in the form of a thin walled cover 514 is provided within the inner housing part 503.6. This cover 514 substantially has the form of a truncated conical shell. At its outer circumference 514.1, the thin walled cover 514 is mounted to the housing 503.1 in a substantially pressure tight manner.

The cover 514 extends between the housing 503.1 and the last lens element 510. At its inner circumference 514.2, the cover 514 is located immediately adjacent to the first lens surface, thereby forming an aperture 514.3 at this inner circumference 514.2. This aperture 514.3 leaves a certain part of the first lens surface 510.3 uncovered by the cover 514.

The cover 514 is not contacting the last lens element 510 directly but via a sealing element in the form of a thin sealing membrane similar to the sealing membrane 15 as it has been described in the context of the first embodiment. This sealing membrane extends between the inner circumference 514.2 of the cover 514 and the last lens element 510. The sealing membrane 15 is connected to the cover 514 and the last lens element 510 in a pressure tight manner.

Thus, the first space 511 and the second space 512 are separated by the cover 514, the sealing membrane 15 and the last lens element 510 in a pressure tight manner to avoid contamination of the first space 511 with contaminants from the environment surrounding the housing.

However, it will be appreciated that, with other embodiments of the invention, instead of the sealing membrane, a sealing gap and a slight flow of gas as it has been described in the context of the second embodiment (see in particular FIG. 6) may be used.

The cover 514 is located such that a first part of the last lens element 510 partly defines the first space 511 and that a second part of the last lens element 510 partly defines the second space 512. The perpendicular projection of this first part of the last lens element 510 onto the first plane 510.2 is smaller than the perpendicular projection of this second part of the last lens element 510 onto the first plane 510.2.

The cover 514 has the beneficial effect that only a second surface region 510.7 of the first lens surface 510.3 is subjected to the first pressure prevailing in the first space 511 while the rest of the lens surface and also the last lens element holder 513 is subjected to the second pressure prevailing in the second space 512. The outer circumference of this second surface region 510.7 is defined by the sealing membrane 15 contacting the first lens surface 510.3.

Thus, the force F acting in the direction of the optical axis 503.2 on the last lens element 510 in the direction of the optical axis 503.2 due to pressure differences between the first pressure $p_1$ in the first space 511 and the second pressure $p_2$ in the second space 512 may be calculated according to equation (1), i.e. as follows:

$$F = A_{ssr} \cdot (p_1 - p_2) = A_{ssr} \cdot dp,$$

wherein: $A_{ssr}$ is the area of the perpendicular projection of the second surface region 510.7 onto the first plane 510.2;

dp is the pressure difference between the first pressure $p_1$ in the first space 511 and the second pressure $p_2$ in the second space 512.

Consequently, a variation $\Delta dp$ in the pressure difference dp will result in a variation $\Delta F$ in the force F which calculates according to equation (2), i.e. as follows:

$$\Delta F = A_{ssr} \cdot \Delta dp.$$

As becomes apparent from equation (2), compared to a conventional design without a cover 514, the cover 514 considerably reduces the variation $\Delta F$ in the force F acting on the last lens element 510 due to a variation $\Delta dp$ in the pressure difference dp between the first space 511 and the second space 512.

Thus, compared to a conventional design with a conventional housing and without a cover 514, at a given pressure variation $\Delta dp$ and a given rigidity of the last lens element holder 513 in the direction of the optical axis 503.2 a lower position variation of the last lens element 510 due to this variation $\Delta dp$ is achieved with the cover 514 according to the invention. Thus, the cover 514 with the sealing membrane 15 forms a load relieving device relieving the last lens element 510 and, thus, the ultimate optical element arrangement from loads resulting from pressure differences within the first space 511 and the second space 512.

As a consequence, to keep certain position variation limits for the last lens element 510 during operation, less effort is required for the rigidity of, both, the last lens element holder 513 and the actuators 517 in the direction of the optical axis 503.2.

It will be appreciated that, to achieve this beneficial effect according to the invention, the aperture 514.3 has a second perpendicular projection onto the first plane 510.2 with a second area $A_2$ which is smaller than the first area $A_1$ of the first perpendicular projection of the last lens element 510 onto the first plane 510.2.

To largely take advantage of this beneficial effect without affecting the optical performance of the optical system, the aperture 514.3 is located as close as possible to the first surface region 510.5 optically used during an exposure process, as it is shown in FIG. 15. Thus, the second area $A_2$ substantially corresponds to of the third perpendicular projection of the first surface region 510.5 onto the first plane 510.2.

In other words, the aperture 514.3 is located as close as possible to the first surface region 510.5 optically used during an exposure process such as to leave uncovered only the first surface region 510.5 while covering the rest of the first surface 510.3.

It will be appreciated that, with other embodiments of the present invention, the first surface region optically used may be smaller than the aperture provided by the cover. Thus, the third area $A_3$ may be smaller than the second area $A_2$. Anyway, preferably, the third area $A_3$ corresponds to at least 80% of the second area $A_2$.

In other words, the aperture may leave uncovered a part of the first surface which is larger than the first surface region optically used and which is including the first surface region optically used. Anyway, preferably, the first surface region optically used corresponds to at least 80% of the part of the first surface left uncovered by the aperture.

Furthermore, It will be appreciated that, with other embodiments of the present invention, depending on the dimensions of the ultimate optical element and the ultimate optical element holder, the aperture may even leave uncovered the entire first surface such that the cover only covers at least a part of the ultimate optical element holder. With comparably large ultimate optical element holders, in particular, this may as well provide a sufficient relief of the ultimate optical element arrangement from stresses resulting from pressure differences between the first space and the second space.

Furthermore, It will be appreciated that, to achieve the above beneficial effects, with other embodiments of the present invention, depending on the rigidity distribution of the ultimate optical element holder, the cover, at its outer circumference, instead of being mounted to the housing 503.1, may also be mounted to the ultimate optical element holder. This may be done at a location where the unit formed by the housing and the ultimate optical element holder connected thereto still has a rigidity which is sufficient to that forces introduced by the cover into the ultimate optical element holder do not substantially dislocate the ultimate optical element. Depending on the design of the ultimate optical element holder, such a location may, for example, be located at the outer circumference of the ultimate optical element holder close to the housing of the ultimate optical element unit.

The cover 514 is formed by a thin sheet metal. Anyway, it will be appreciated that, with other embodiments of the present invention, the cover may also be formed by one or more layers of metal and/or of different materials such as composite materials, plastics, ceramics, glass and any combination thereof.

The cover 514 has a rigidity in the direction of the optical axis 503.2 which is sufficient to prevent direct contact of the cover 514 with the last lens element 510 under any pressure difference between the first space 511 and the second space 512 that is to be expected during normal use of the optical element unit 503. Anyway, the cover 514, within the limitations stated above, may undergo deformations. Thus, the cover 514 may be of very simple and lightweight design occupying relatively few space.

Since the cover 514 is a part mounted separately to the housing 503.1, the distance between the last lens element 510 and the inner circumference of the cover may easily be adjusted to the specific requirements of the respective application. Furthermore, it will be appreciated that either one of the cover 514 and the last lens element 510 may be adapted in geometry and surface properties, respectively, to provide appropriate or optimized sealing boundaries within the gap between them.

Anyway, it will be appreciated that, with other embodiments of the present invention, the cover may also be formed monolithically with the part of the housing provided by the optical element module it is mounted to.

The sealing membrane allows for relative motions between the cover 514 and the last lens element 510 caused by such variations in the pressure difference between the first space 511 and the second space 512.

It will be appreciated that, with other embodiments of the present invention, instead of the sealing membrane 15, another type of elastic sealing element or sealing substance, such as an elastic glue or the like, may be located between the cover and the last lens element. Furthermore, a substantially rigid connection between the cover and the last lens element may be chosen, provided that the cover in itself is of sufficient rigidity in the direction of the optical axis so as to not transfer a substantial part of the loads resulting from pressure differences between the first and second space onto the ultimate optical element.

It will be appreciated that the optical element unit 503 may be manufactured using the method of manufacturing an optical element according to the present invention as it has been described above in the context of the first embodiment (i.e. with reference to FIGS. 1 to 4).

It will be further appreciated that, with other embodiments of the present invention, the covers described above in the context of the second to fifth embodiment may also be used together with an ultimate optical element module that is connected to the penultimate optical element module by a set of actuators as it has been described above in the context of the sixth embodiment.

Although, in the foregoing, embodiments of the present invention have been described where the ultimate optical element and the load relieving device are located at an exit end of an optical element unit, it will be appreciated that, with other embodiments of the present invention, the ultimate optical element and the load relieving device may be located at any different location requiring a relief of an optical element from loads resulting from pressure differences in the region of the respective optical element. Thus, the ultimate optical element and the load relieving device may be located at a transition area between the optical element unit and a further optical device, such as a further optical element unit. Furthermore, of course, the ultimate optical element and the load relieving device may be located at an entrance end of an optical element unit.

Furthermore, the present invention has been described in the context of embodiments with rotationally symmetric optical components. Anyway, it will be appreciated that the invention may also be used in the context of any other optical element units comprising at least in part rotationally asymmetric components, in particular rotationally asymmetric ultimate optical elements.

Furthermore, the present invention has been described in the context of embodiments with an ultimate optical element that on both sides is contacted by a gas atmosphere. Anyway, it will be appreciated that the invention may also be used in the context of so called immersion systems where a part of the ultimate optical element is immersed in an immersion bath of an immersion medium located between the ultimate optical element and the substrate, e.g. the wafer, to be worked.

Finally, the present invention has been described in the context of embodiments for optical exposure processes. Anyway, it will be appreciated that the invention may also be used in the context of any other optical application, where a relief of an optical element from loads resulting from pressure differences in the region of the respective optical element is required.

What is claimed is:

1. A unit, comprising:
   an optical element group configured to project exposure light along an optical axis of the optical element group;
   a support structure having an inner part partly defining a first space and an exposure light passageway between the first space and a second space, the inner part receiving the optical element group; and
   a tempering device configured to be heated and/or cooled;
   wherein:
   the optical element group comprises an ultimate optical element located in a region of the exposure light passageway;
   the tempering device extends to a surface of the ultimate optical element so that an open gap is between the surface of the ultimate optical element and the tempering device;
   the open gap is configured to allow fluids to pass therethrough during operation of the unit; and
   the tempering device is configured so that a further exposure light passageway is defined for exposure light passing the surface of the ultimate optical element.

2. The unit of claim 1, wherein the open gap is configured so that, during operation of the unit, a fluid passes through the open gap between a first space comprising the further exposure light passageway and a second space defined between the tempering device and the support structure.

3. The unit of claim 1, wherein the tempering device comprises a heat exchanging element connectable to a heat exchanging device to provide heating and/or cooling of the tempering device.

4. The unit of claim 3, wherein the heat exchanging element comprises at least one member selected from the group consisting of a heat exchange medium line, a heat conducting element, an element enhancing heat transfer performance, and a heat transfer rib.

5. The unit of claim 3, wherein the heat exchanging element is located on a side of the tempering device facing toward the ultimate optical element.

6. The unit of claim 3, wherein the heat exchanging element is located on a side of the tempering device facing away from the ultimate optical element.

7. The unit of claim 3, wherein the heat exchanging element is integral with the tempering device.

8. The unit of claim 3, wherein the heat exchanging element is a heat exchange medium line configured to be fed, via the heat exchanging device, with a heating medium and/or a cooling medium.

9. The unit of claim 3, wherein the tempering device comprises a plurality of circularly arranged heat exchange medium lines.

10. The unit of claim 1, wherein an inner circumference of the tempering device defines an aperture for the exposure light.

11. The unit of claim 1, wherein the tempering device has an inner circumference and an outer circumference, and the tempering device is connected to the support structure at the outer circumference.

12. The unit of claim 1, wherein:
   the surface of the ultimate optical element is an optical surface having a surface region that is optically used when the optical element group is used to pass exposure light along the optical axis; and
   the tempering device extends close to the optically used surface region.

13. The unit of claim 12, wherein the optically used surface region corresponds to at least 80% of the further exposure light passageway.

14. The unit of claim 10, wherein an extension of the further exposure light passageway is substantially identical to an extension of the optically used surface region.

15. The unit of claim 1, wherein the tempering device is a thin walled cover.

16. The unit of claim 1, wherein the tempering device comprises a thin wall segment extending: a) between the support structure and the ultimate optical element; and b) in a circumferential direction of the ultimate optical element.

17. The unit of claim 1, wherein:
   the tempering device comprises at least one layer;
   each layer of the tempering device comprises a member selected from the group consisting of a metal material, a sheet metal material, a composite material, a plastics material, a ceramic material, and a glass material.

18. The unit of claim 1, wherein the tempering device does not directly contact the ultimate optical element.

19. The unit of claim 1, wherein the optical element group comprises a penultimate optical element adjacent the ultimate optical element, and the surface of the ultimate optical element faces toward the penultimate optical element or away from the penultimate optical element.

20. The unit of claim 1, wherein the ultimate optical element is supported by the support structure via a holding device, and the tempering device is a component separate from the holding device.

21. The unit of claim 1, wherein the cover device is supported by:
   the support structure; and/or
   a heat exchanger shell defining part of the heat exchanging device and surrounding at least part of the support structure.

22. An apparatus, comprising:
   an illumination system configured to illuminate a mask;
   a projection objection configured to transfer an image of the mask onto a light sensitive material,
   wherein the projection objective comprises a unit according to claim 1.

23. An unit, comprising:
   an optical element group configured to project exposure light along an optical axis of the optical element group;
   a support structure supporting the optical element group; and
   a tempered element;
   wherein:
   the optical element group comprises an optical element;
   the tempered element extends to a surface of the optical element;
   the tempered element defines an exposure light passageway; and the tempered element and the surface of the ultimate optical element define an open gap through which fluids can pass during operation of the unit.

* * * * *

UNITED STATES PATENT AND TRADEMARK OFFICE
CERTIFICATE OF CORRECTION

PATENT NO. : 9,841,577 B2
APPLICATION NO. : 15/251265
DATED : December 12, 2017
INVENTOR(S) : Johannes Lippert It is certified that error appears in the above-identified patent and that said Letters Patent is hereby corrected as shown below:

In the Specification

Column 2, Line 48, delete "the the" and insert -- the --.

Column 3, Line 32, delete "least" and insert -- at least --.

Column 7, Line 5, delete "$A_{ssr}$," and insert -- $A_{ssr}$ --.

Column 17, Line 25, delete "$A_{ssr}$," and insert -- $A_{ssr}$ --.

Column 20, Line 40, delete "to holder" and insert -- holder --.

Column 25, Line 48, delete "sufficient to" and insert -- sufficient --.

Signed and Sealed this
Thirteenth Day of March, 2018

Andrei Iancu
*Director of the United States Patent and Trademark Office*